United States Patent
Imai

(10) Patent No.: US 7,932,846 B2
(45) Date of Patent: Apr. 26, 2011

(54) A/D CONVERTER AND RANDOM-NOISE REDUCING METHOD FOR A/D CONVERTERS

(75) Inventor: Shigeo Imai, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 12/493,436

(22) Filed: Jun. 29, 2009

(65) Prior Publication Data

US 2010/0103009 A1 Apr. 29, 2010

(30) Foreign Application Priority Data

Oct. 29, 2008 (JP) .................. 2008-278689

(51) Int. Cl.
*H03M 1/10* (2006.01)
(52) U.S. Cl. .......... 341/155; 341/118; 341/122
(58) Field of Classification Search .......... 341/118, 341/120, 143, 155
See application file for complete search history.

(56) References Cited

U.S. PATENT DOCUMENTS

| | | | |
|---|---|---|---|
| 6,317,071 B1 * | 11/2001 | Kolsrud et al. | 341/155 |
| 6,522,282 B1 * | 2/2003 | Elbornsson | 341/155 |
| 6,784,814 B1 * | 8/2004 | Nair et al. | 341/118 |
| 7,312,734 B2 | 12/2007 | McNeill et al. | |

FOREIGN PATENT DOCUMENTS

JP 07-312551 11/1995

* cited by examiner

*Primary Examiner* — Brian Young
(74) *Attorney, Agent, or Firm* — Turocy & Watson, LLP

(57) ABSTRACT

An A/D converter includes a sample/hold unit that samples an input analog signal at a predetermined timing to hold m (m≧2) equal analog values and successively outputs the m held equal analog values in time series; an A/D converting unit that converts the m equal analog values successively input in time series from the sample/hold unit to m digital signals in time series; a data-alignment adjusting circuit that adjusts timings of the m digital signals successively input in time series from the A/D converting unit to parallelize the m digital signals; and an averaging circuit that outputs an average value of the m digital signals input in parallel from the data-alignment adjusting circuit as a final A/D conversion result.

16 Claims, 14 Drawing Sheets

A/D CONVERTER AND RANDOM-NOISE REDUCING METHOD FOR A/D CONVERTERS

CROSS-REFERENCE TO RELATED APPLICATIONS

This application is based upon and claims the benefit of priority from the prior Japanese Patent Application No. 2008-278689, filed on Oct. 29, 2008; the entire contents of which are incorporated herein by reference.

BACKGROUND OF THE INVENTION

1. Field of the Invention

The present invention relates to an Analog-to-Digital (A/D) converter and a random-noise reducing method for A/D converters.

2. Description of the Related Art

It is desirable that A/D converters have a high Signal to Noise Ratio (SNR) indicative of a ratio between output signal power and noise power. In recent years, with a decrease in power-supply voltage due to microfabrication, it has become difficult to ensure a signal amplitude (signal power), thereby making it difficult to achieve a high SNR. For this reason, in particular, to sustain and further improve the SNR under low power-supply voltage, it is crucial how to reduce noise power.

As a method of reducing noise power, an example of technology is suggested in U.S. Pat. No. 7,312,734 in which two A/D converters are operated in parallel to average their outputs, thereby improving the SNR by 3 decibels. In this method, however, two A/D converters are used, thereby disadvantageously causing an increase in area occupancy and current consumption.

In another example of technology suggested in JP-A H07-312551 (KOKAI), A/D conversion is performed a plurality of times while an analog signal is held in a sample/hold circuit to average data obtained through these plural conversions. In this method, however, the sample/hold operation is performed by only one sample/hold circuit using one capacitive element. Therefore, even A/D conversion is performed a plurality of times on the held data, noise occurring at the sample/hold circuit and noise superposing on an input analog signal at the time of the sample/hold operation cannot be averaged. Since the noise occurring at the sample/hold circuit accounts for a large proportion with respect to SNR characteristics of the A/D converter, the incapability of reducing the noise by averaging is very problematic.

BRIEF SUMMARY OF THE INVENTION

According to one aspect of the present invention, an A/D converter includes a sample/hold unit that samples an input analog signal at a predetermined timing to hold m (m≧2) equal analog values and successively outputs the m held equal analog values in time series; an A/D converting unit that converts the m equal analog values successively input in time series from the sample/hold unit to m digital signals in time series; a data-alignment adjusting circuit that adjusts timings of the m digital signals successively input in time series from the A/D converting unit to parallelize the m digital signals; and an averaging circuit that outputs an average value of the m digital signals input in parallel from the data-alignment adjusting circuit as a final A/D conversion result.

According to another aspect of the present invention, an A/D converter includes a pipeline-type A/D converting unit that converts an input analog signal to m (m≧2) digital signals sequentially from a most significant bit through pipeline processing; a data-alignment adjusting circuit that adjusts timings of the m digital signals successively input in time series from the pipeline-type A/D converting unit to parallelize the m digital signals; and an averaging circuit that outputs an average value of the m digital signals input in parallel from the data-alignment adjusting circuit as a final A/D conversion result, wherein an initial stage of the pipeline-type A/D converting unit includes m+1 sampling function units to which the analog signal is input in parallel, and one operational amplifier that outputs the analog values held in the m+1 sampling function units to a subsequent stage, the m+1 sampling function units and the operational amplifier successively outputting m held values in time series to the subsequent stage by repeating an operation in which: m sampling function units among the m+1 sampling function units start and end at a same timing a sampling operation on the input analog signal with respective control signals to hold the m equal analog values, and sequentially couple the analog values one by one to the operational amplifier to successively output the m held values to the subsequent stage, and at a timing of coupling a last one of the analog values to the operational amplifier, the m sampling function units with their combination changed each sample a similarly-input analog signal with a respective control signal at a same timing, and sequentially couple the analog values one by one to the operational amplifier, m+1 comparing function units provided to have a one-to-one relation with the m+1 sampling function units, each of the m+1 comparing function units determining a logical value of a most significant bit from the input analog signal, and m+1 D/A converting units provided to have a one-to-one relation with the m+1 comparing function units, each of the m+1 D/A converting units performing an adding/subtracting process on a held value coupled by a relevant one of the sampling function units to the operational amplifier according to a comparison result from a relevant one of the comparing function units.

According to still another aspect of the present invention, a random-noise reducing method for A/D converters, the method includes sampling an input analog signal at a predetermined timing to hold m (m≧2) equal analog values and successively outputting the m held equal analog values in time series; converting the m equal analog values successively input in time series to m digital signals in time series; and adjusting timings of the m digital signals converted in time series, parallelizing the m digital signals, and outputting an average value of the m digital signals as a final A/D conversion result.

According to still another aspect of the present invention, a random-noise reducing method executed in A/D converters, each of the A/D converters includes a pipeline-type A/D converting unit that converts an input analog signal to m (m≧2) digital signals sequentially from a most significant bit through pipeline processing, a data-alignment adjusting circuit that adjusts timings of the m digital signals successively input in time series from the pipeline-type A/D converting unit to parallelize the m digital signals, and an averaging circuit that outputs an average value of the m digital signals input in parallel from the data-alignment adjusting circuit as a final A/D conversion result, the method includes successively outputting m held values in time series to the subsequent stage by repeating an operation at an initial stage of the pipeline-type A/D converting unit, in m+1 sampling function units to which the analog signal is input in parallel, and one operational amplifier that outputs the analog values held in the m+1 sampling function units to a subsequent stage, in which: m sampling function units among the m+1 sampling function units start and end a sampling operation on the input analog signal with respective control signals at a same timing to hold m equal analog values, and sequentially couple the analog values one by one to the operational amplifier to successively output the m held values to the subsequent stage, and at a timing of coupling a last one of the analog values to the operational amplifier, the m sampling function units with their combination changed each sample a similarly-input analog signal with a respective control signal at a same timing, and sequentially couple the analog values one by one to the operational amplifier; determining, in m+1 comparing function units, a logical value of a most significant bit from the input analog signal input with a one-to-one relation with the m+1 sampling function units; and performing, in m+1 D/A converting units provided to have a one-to-one relation with the m+1 comparing function units, an adding/subtracting process on a held value coupled by a relevant one of the sampling function units to the operational amplifier according to a comparison result from a relevant one of the comparing function units.

DETAILED DESCRIPTION OF THE INVENTION

Exemplary embodiments of an A/D converter and a random-noise reducing method for A/D converter according to the present invention will be explained below in detail with reference to the accompanying drawings. The present invention is not limited to the following embodiments.

First Embodiment

Figure 1:
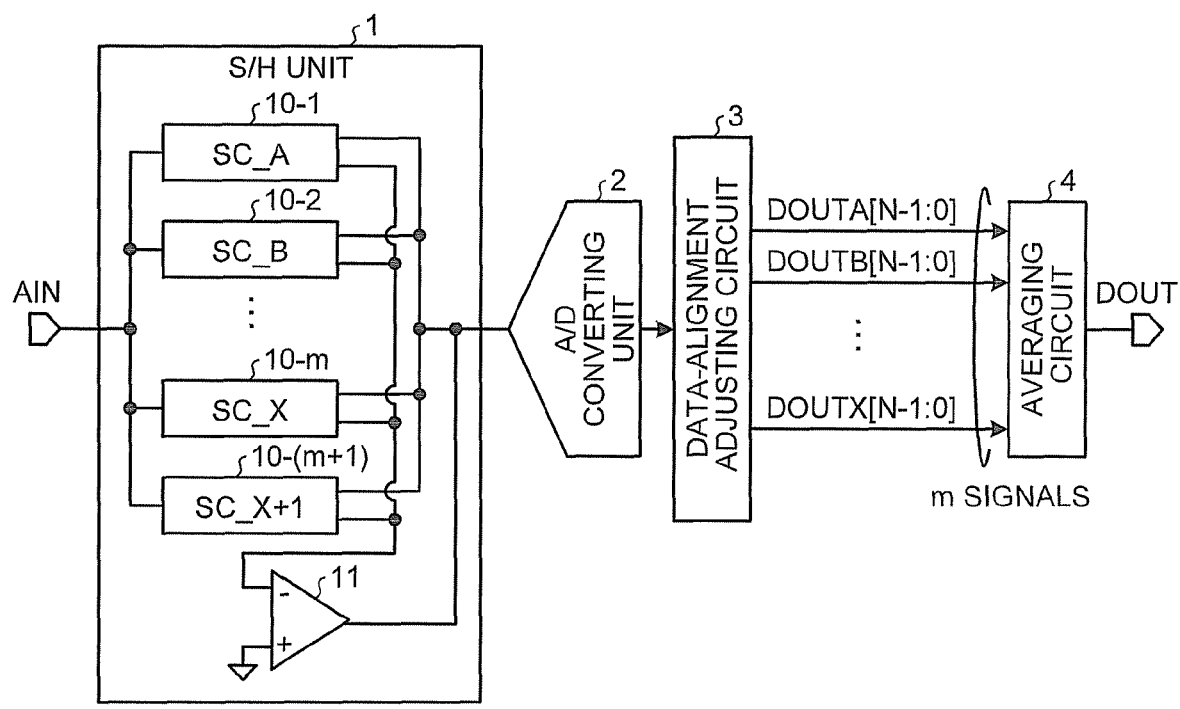
FIG. 1 is a block diagram of the configuration of an A/D converter according to a first embodiment of the present invention.

FIG. 1 is a block diagram of the configuration of an A/D converter according to a first embodiment of the present invention. As depicted in FIG. 1, the A/D converter according to the first embodiment includes one sample/hold (S/H) unit 1, one A/D converting unit 2, one data-alignment adjusting circuit 3, and an averaging circuit 4. Hereinafter, the sample/hold unit 1 is referred to as "S/H unit 1".

The S/H unit 1 includes m+1 (m≧2) sampling function units (SC_A to SC_X+1) 10-1 to 10-(m+1) to which an analog signal AIN is input in parallel, and one operational amplifier (hereinafter, referred to as an "OP amp") 11.

Between an inverting input terminal (−) and an output terminal of the OP amp 11, outputs (held analog values, respectively) of m+1 sampling function units 10-1 to 10-(m+1) are coupled in sequence. The output terminal of the OP amp 11 is connected to an input terminal of the A/D converting unit 2. A non-inverting input terminal (+) of the OP amp 11 is supplied with a bias voltage.

Of these m+1 sampling function units 10-1 to 10-(m+1), m sampling function units start and end a sampling operation on the input analog signal AIN at the same timing with respective control signals defined at a constant sampling cycle to hold m analog values that are equal to each other, and then sequentially couple them one by one to the OP amp 11. With this, m equal analog values are successively output from the OP amp 11 to the A/D converting unit 2 at the subsequent stage in time series. The held m equal analog values are then sampled by the respective sampling function units, and are then coupled to the OP amp 11 at the respective timings. Therefore, in each of these m equal analog values, a noise signal occurring at each sampling function unit and the OP amp 11 is included.

Figure 3:
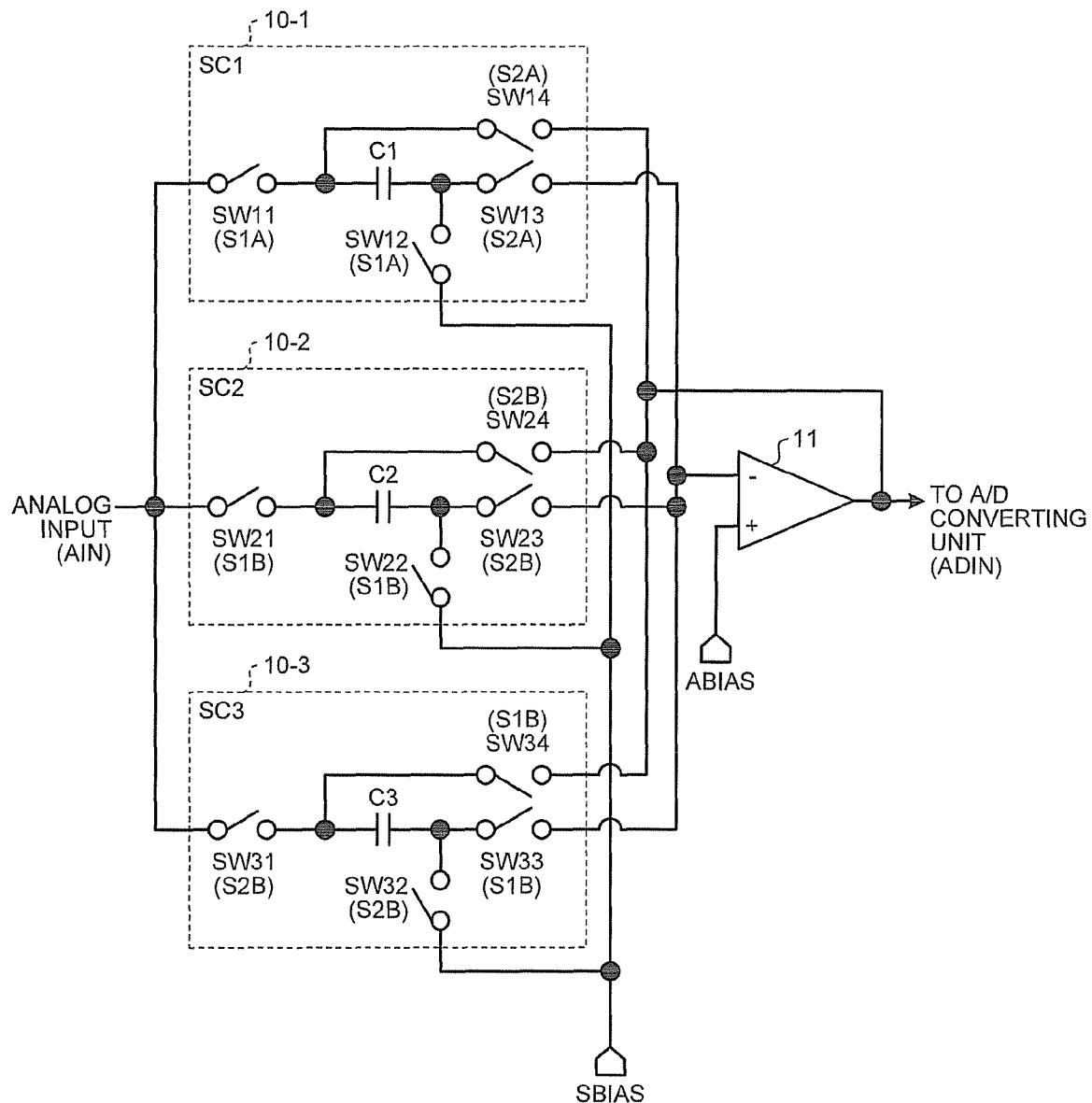
FIG. 3 is a circuit diagram depicting an example of configuration of a sample hold (S/H) unit depicted in FIG. 1.

As for the m+1 sampling function units 10-1 to 10-(m+1), when the last one of m equal analog values sampled as explained above is coupled to the OP amp 11, m sampling function units with their combination changed sample the input analog signal AIN in a similar manner with the respective control signals at the same timing for coupling to the OP amp 11 one by one in sequence. With this, next m equal analog signals held are successively output in time series from the OP amp 11 to the A/D converting unit 2 at the subsequent stage. The m+1 sampling function units 10-1 to 10-(m+1) are configured to repeat the operation explained above. Here, the m+1 sampling function units 10-1 to 10-(m+1) are each configured exemplarily as depicted in FIG. 3, which will be explained further below.

The A/D converting unit 2 is an A/D converter of a pipeline type or a flash type. The A/D converting unit 2 is configured to convert m equal analog values, which are successively input from the S/H unit 1 at constant sampling time intervals in time series and each have a different noise signal, to m N-bit digital signals DOUTA[N-1:0] to DOUTX[N-1:0], which are successive in time series with a processing time being 1/m of the sampling time interval.

The data-alignment adjusting circuit 3 is configured to adjust timings of m N-bit digital signals DOUTA[N-1:0] to DOUTX[N-1:0], which are successively input in time series from the A/D converting unit 2 and parallelize these signals.

The averaging circuit 4 calculates an average value of m N-bit digital signals DOUTA[N-1:0] to DOUTX[N-1:0] input in parallel from the data-alignment adjusting circuit 3 to generate one N-bit digital signal DOUT[N-1:0] with the noise signal reduced through an averaging process, and outputs the generated signal as a final A/D conversion result.

Figure 2:
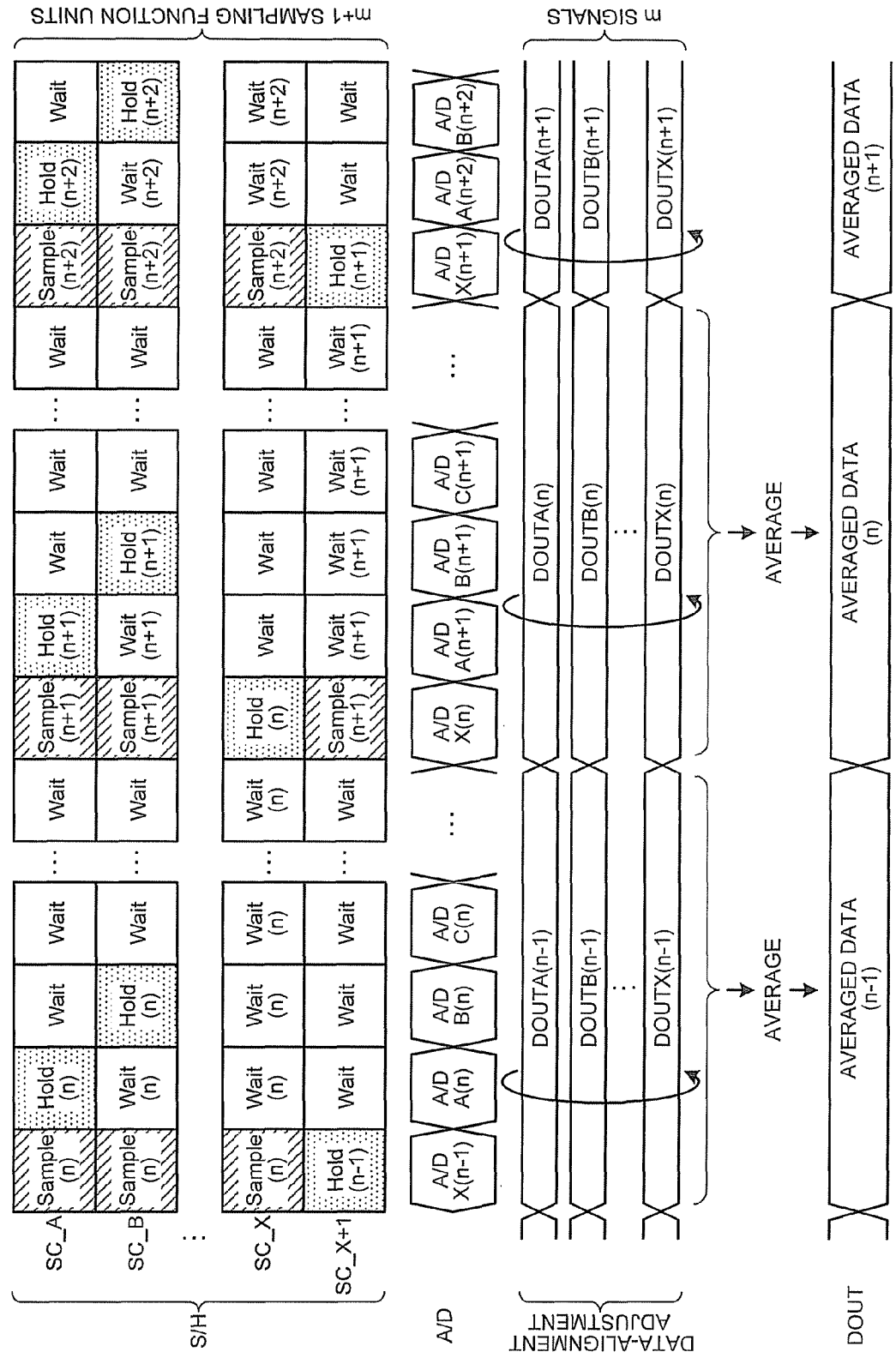
FIG. 2 is a timing chart for explaining the operation of the A/D converter depicted in FIG. 1.

Next, the operation is explained with reference to FIG. 2. FIG. 2 is a timing chart for explaining the operation of the A/D converter depicted in FIG. 1. In FIG. 2, operations are explained at a sampling timing n and a next sampling timing n+1. Between sampling timings, m control timings are formed.

In FIG. 2, in the S/H unit 1, at the first control timing at the time of starting a sampling timing n, m sampling function units SC_A to SC_X simultaneously start and end a sampling operation. At this time, the remaining one sampling function unit SC_X+1 couples an analog value (n−1) held at the previous sampling timing n−1 to the OP amp 11. That is, m-th one of the m equal analog values (n−1) held at the previous sampling timing n−1 is output from the OP amp 11 to the A/D converting unit 2.

At the next control timing, the sampling function unit SC_A couples the analog value (n) held in a manner explained above to the OP amp 11. That is, the first one of the m equal analog values (n) held at the sampling timing n is output from the OP amp 11 to the A/D converting unit 2. The remaining sampling function units SC_B to SC_X are in a wait state Wait (n), holding the analog value (n). On the other hand, the sampling unit SC_X+1 is in a wait state Wait without any analog value to be held.

At the next control timing, the sampling function unit SC_A is in a wait state Wait. The sampling function unit SC_B couples an analog value (n) held in the manner explained above to the OP amp 11. That is, the second one of the m equal analog values (n) held at the sampling timing n is output from the OP amp 11 to the A/D converting unit 2. The remaining sampling function units SC_C to SC_X sustain the wait state Wait (n), holding the analog value (n). The sampling function unit SC_X+1 sustains the wait state Wait.

Thereafter, among the m sampling function units SC_A to SC_X performing the sampling operation, each sampling function unit in the wait state Wait(n) couples the held analog value (n) in a predetermined order to the OP amp 11, and causes the value to be sequentially output from the OP amp 11 to the A/D converting unit 2. During this, the sampling function unit SC_X+1 not performing the sampling operation at the time of starting the sampling timing n sustains the wait state Wait.

Then, at the timing of coupling to the OP amp 11 the m-th analog value (n) held by the sampling function unit SC_X that is in the wait state Wait (n) to the last from among the m sampling function units SC_A to SC_X simultaneously performing the sampling operation at the time of starting the sampling timing n, the next sampling timing n+1 starts.

At the control timing at the timing of starting the sampling timing n+1, an m-th analog value (n) held by the sampling function unit SC_X is output to the A/D converting unit 2. At the same time, the m sampling function units SC_A to SC_X+1 with their combination changed perform a sampling operation. In a procedure similar to that explained above, m analog values (n+1) sampled at the same time are successively output in time series to the A/D converting unit 2. At the time of starting the sampling timing n+1, the sampling function unit SC_X causes the m-th analog value (n) held at this time to be output to the A/D converting unit 2, and is then in a wait state Wait.

In this manner, at the respective sampling timings, among the m+1 sampling function units SC_A to SC_X+1, m sampling function units with their combination changed successively output to the A/D converting unit 2 in time series the m equal analog values simultaneously sampled.

In the A/D converting unit 2, at the sampling timing n, m equal analog values (n) successively input from the S/H unit 1 and simultaneously sampled at the time of starting the sampling timing n are sequentially converted to m successive digital values A/D_A(n) to A/D_X(n) for output to the data-alignment adjusting circuit 3.

The data-alignment adjusting circuit 3 parallelizes transition timings of m digital values A/D_A(n) to A/D_X(n) for m analog values (n) at the sampling timing n that are successively input from the A/D converting unit 2, with reference to the timing of the digital value A/D value _X(n) input the m-th order, sustains these values until an m-th digital value A/D_X (n+1) inputs among the m digital values A/D_A(n+1) to A/D_X(n+1) for the m analog values (n+1) at the next sampling timing n+1 that are successively input from the A/D converting unit 2, and then outputs these values to the averaging circuit 4.

Then, the averaging circuit 4 finds an average value of the m digital values A/D_A(n) to A/D_X(n) parallelized at the sampling timing n to generate average data (n), finds an average value of the m digital values A/D_A(n+1) to A/D_X (n+1) parallelized at the sampling timing n+1 to generate average data (n+1), and then output each piece of the average data as a final A/D conversion result.

[Operation and Configuration Example of the Sampling Function Units (Switched Capacitors (SC))]

Figure 4:
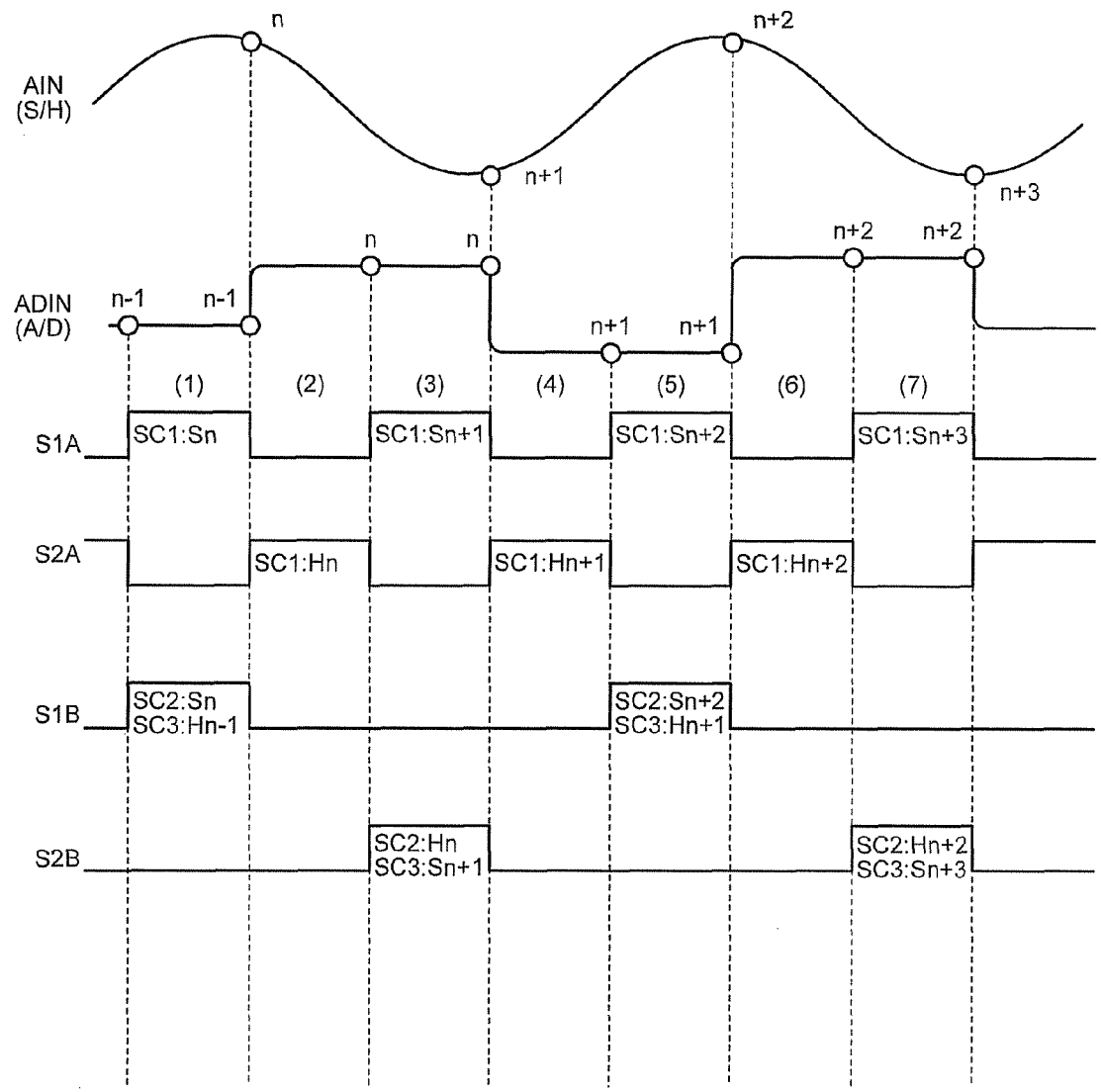
FIG. 4 is a timing chart for explaining the operation of the S/H unit depicted in FIG. 3.

FIG. 3 is a circuit diagram depicting an example of configuration of a S/H unit depicted in FIG. 1. FIG. 4 is a timing chart for explaining the operation of the S/H unit depicted in FIG. 3.

In FIG. 3, a configuration example of the S/H unit 1 is depicted where m=2. The sampling function units of the S/H unit 1 depicted in FIG. 1 where m=2 include, as depicted in FIG. 3, a sampling function unit (SC1) 10-1 corresponding to the sampling function unit SC_A, a sampling function unit (SC2) 10-2 corresponding to the sampling function unit SC_B, and a sampling function unit (SC3) 10-3 corresponding to the sampling function unit SC_X+1. These three sampling function units (SC1 to SC3) 10-1 to 10-3 have the same configuration.

The sampling function unit (SC1) 10-1 includes switches SW11, SW12, SW13, and SW14 and a capacitative element C1. The analog signal AIN is input to one end of the switch SW11. The other end of the switch SW11 has connected thereto one end of the capacitative element C1 and one end of the switch SW14. The other end of the capacitative element C1 has connected thereto one end of the switch SW12 and one end of the switch SW13. The other end of the switch SW12 is supplied with a sampling bias SBIAS. The other end of the switch SW13 is connected to the inverting input terminal (−) of the OP amp 11. The other end of the switch SW14 is connected to the output terminal of the OP amp 11. The switches SW11 and SW12 are subjected to open/close control with a control signal S1A. The switches SW13 and SW14 are subjected to open/close control with a control signal S2A.

The sampling function unit (SC2) 10-2 includes switches SW21, SW22, SW23, and SW24 and a capacitative element C2. The analog signal AIN is input to one end of the switch SW21. The other end of the switch SW21 has connected thereto one end of the capacitative element C2 and one end of the switch SW24. The other end of the capacitative element C2 has connected thereto one end of the switch SW22 and one end of the switch SW23. The other end of the switch SW22 is supplied with the sampling bias SBIAS. The other end of the switch SW23 is connected to the inverting input terminal (−) of the OP amp 11. The other end of the switch SW24 is connected to the output terminal of the OP amp 11. The switches SW21 and SW22 are subjected to open/close control with a control signal S1B. The switches SW23 and SW24 are subjected to open/close control with a control signal S2B.

The sampling function unit (SC3) 10-3 includes switches SW31, SW32, SW33, and SW34 and a capacitative element C3. The analog signal AIN is input to one end of the switch SW31. The other end of the switch SW31 has connected thereto one end of the capacitative element C3 and one end of the switch SW34. The other end of the capacitative element C3 has connected thereto one end of the switch SW32 and one end of the switch SW33. The other end of the switch SW32 is supplied with the sampling bias SBIAS. The other end of the switch SW33 is connected to the inverting input terminal (−) of the OP amp 11. The other end of the switch SW34 is connected to the output terminal of the OP amp 11. The switches SW31 and SW32 are subjected to open/close control with the control signal S2B. The switches SW33 and SW34 are subjected to open/close control with the control signal S1B.

Next, the operation is explained with reference to FIG. 4, which depicts an exemplary operation of "Sample", "Hold", and "two wait types Wait(n) and Wait" at the S/H unit 1 depicted in FIG. 1 where m=2.

FIG. 4 depicts a waveform of the input analog signal AIN, a waveform of an analog signal value (an input of the A/D converting unit) held for output from the OP amp 11 to the A/D converting unit 2, and waveforms of the control signals S1A, S2A, S1B, and S2B.

Timings n, n+1, n+2, and n+3 indicated on the waveform of the analog signal AIN are those for division into predetermined sampling cycles for the S/H unit 1, each representing a timing of a moment of holding the sampled analog signal. Here, two timings on the waveform of the input of the A/D converting unit input ADIN, such as (n−1, n−1), (n, n), (n+1, n+1), and (n+2, n+2), each represent a conversion timing of the A/D converting unit 2. Although not depicted in FIG. 3, in the example depicted in FIG. 1, the conversion speed of the A/D converting unit 2 where m=2 is twice as high as the operation speed of the S/H unit 1, and FIG. 3 depicts as such.

The control signal S1A is a signal with an ON time width and an OFF time width being equal to each other, and its one cycle is identical to the sampling cycle. In the example depicted in FIG. 4, the control signal S1A is a signal which is in an OFF state in the first half of the sampling cycle and in an ON state in the latter half of the sampling cycle. That is, the timings n, n+1, n+2, and n+3 are those of moments when the control signal S1A is in an OFF state. The control signal S2A is a signal obtained by logically inverting the control signal S1A.

The control signals S1B and S2B are those decimated every other ON-time timing of the control signal S1A. The control signals S1B and S2B are shifted in phase by one cycle of the control signal S1A. In the example depicted in FIG. 4, the control signal S1B is in an OFF state at the timings n and n+2, and the control signal S2B is in an OFF state at the timings n+1 and n+3.

In the following, the operation of the sampling function units (SC1 to SC3) 10-1 to 10-3 in seven operation periods (1) to (7) is explained.

The operation period (1) is a period corresponding to the latter half of the sampling cycle n−1. In this period, the control signals S1A and S1B are in an ON state, whilst the control signals S2A and S2B are in an OFF state. In the sampling function unit (SC1) 10-1, the switches SW11 and SW12 are in a closed-circuit state, while the switches SW13 and SW14 are in an open-circuit state. Therefore, with reference to the sampling bias SBIAS, the analog signal AIN is sampled to the capacitative element C1. Then, an analog value Sn of the analog signal AIN at a timing n of the moment when the control signal S1A is in an OFF state and the switches SW11 and SW12 are in a closed-circuit state is held in the capacitative element C1 (SC1: analog value Sn).

Also, in the sampling function unit (SC2) 10-2, the switches SW21 and SW22 are in a closed-circuit state, while the switches SW23 and SW24 are in an open-circuit state. Therefore, with reference to the sampling bias SBIAS, the analog signal AIN is sampled to the capacitative element C2. Then, an analog value Sn of the analog signal AIN at a timing n of the moment when the control signal S1B is in an OFF state and the switches SW21 and SW22 are in a closed-circuit state is held in the capacitative element C2 (SC2: analog value Sn).

On the other hand, in the sampling function unit (SC3) 10-3, the switches SW31 and SW32 are in an open-circuit state, while the switches SW33 and SW34 are in a closed-circuit state. Therefore, an analog value (n−1) of the analog signal AIN held in the capacitative element C3 at the previous timing n−1 is coupled between the inverting input terminal (−) and the output terminal of the OP amp 11. With this, the analog value held in the capacitative element C3 at the previous timing n−1 is output as a hold value Hn−1 from the OP amp 11 to the A/D converting unit at the subsequent stage, which is not shown (SC3: analog value Hn−1).

The next operation period (2) is a period corresponding to the first half of the sampling cycle n. In this period, the control signals S1A, S1B, and S2B are in an OFF state, while the control signal S2A is in an ON state. In the sampling function units (SC1) 10-1, the switches SW11 and SW12 are in an open-circuit state, while the switches SW13 and SW14 are in a closed-circuit state. Therefore, an analog value Sn held in the capacitative element C1 at the timing n is coupled between the inverting input terminal (−) and the output terminal of the OP amp 11. With this, the first analog value Sn held in the capacitative element C1 is output as a hold value Hn from the OP amp 11 to the A/D converting unit at the subsequent stage, which is not shown (SC1: analog value Hn).

On the other hand, in the sampling function unit (SC2) 10-2, the switches SW21, SW22, SW23, and SW24 are all in an open-circuit state. Therefore, the sampling function unit (SC2) 10-2 is in a wait state, holding the analog value Sn held in the capacitative element C2 at the timing n. This is a wait state Wait (n) depicted in FIG. 2.

Also, in the sampling function unit (SC2) 10-3, the switches SW31, SW32, SW33, and SW34 are all in an open-circuit state, but no analog value is held in the capacitative element C3. Therefore, the sampling function unit (SC2) 10-3 is in a wait state without any analog value to be held. This is a wait state Wait depicted in FIG. 2.

The next operation period (3) is a period corresponding to the latter half of the sampling cycle n. In this period, the control signals S1A and S2B are in an ON state, while the control signals S2A and S1B are in an OFF state. In the sampling function units (SC1) 10-1, the switches SW11 and SW12 are in a closed-circuit state, while the switches SW13 and SW14 are in an open-circuit state. Therefore, as with the operation period (1), sampling to the capacitative element C1 is performed. Then, an analog value Sn+1 of the analog signal AIN at the timing n+1 of the moment when the control signal S1A is in an OFF state and the switches SW11 and SW12 are in a closed-circuit state is held in the capacitative element C1 (SC1: analog value Sn+1).

Also, in the sampling function unit (SC3) 10-3, the switches SW31 and SW32 are in a closed-circuit state, while the switches SW33 and SW34 are in an open-circuit state. Therefore, sampling to the capacitive element C3 is performed. Then, an analog value Sn+1 of the analog signal AIN at the timing n+1 of the moment when the control signal S1B is in an OFF state and the switches SW31 and SW32 are in an open-circuit state is held in the capacitive element C3 (SC3: analog value Sn+1).

On the other hand, in the sampling function unit (SC2) 10-2, the switches SW21 and SW22 are in an open-circuit state, while the switches SW23 and SW24 are in a closed-circuit state. Therefore, an analog value Sn of the analog signal AIN held in the capacitive element C2 at the previous timing n is coupled between the inverting input terminal (−) and the output terminal of the OP amp 11. With this, the analog value Sn held in the capacitive element C2 at the previous timing n is output as a hold value Hn from the OP amp 11 to the A/D converting unit at the subsequent stage, which is not shown (SC2: analog value Hn).

The next operation period (4) is a period corresponding to the first half of the sampling cycle n+1. In this period, the control signals S1A, S1B, S2B are in an OFF state, while the control signal S2A is in an ON state. This state is the same as the state in the operation period (2). Therefore, in the sampling function unit (SC1) 10-1, an analog value Sn+1 held in the capacitive element C1 at the timing n+1 is output as a hold value Hn+1 from the OP amp 11 to the A/D converting unit, which is not shown (SC1: analog value Sn+1). On the other hand, the sampling function unit (SC2) 10-2 is in a wait state without any analog value to be held. Furthermore, the sampling function unit (SC3) 10-3 is in a wait state, holding the analog value Sn+1.

The next operation period (5) is a period corresponding to the latter half of the sampling cycle n+1. In this period, each control signal is in a state as explained in the operation period (1). Therefore, in the sampling function units (SC1 to SC3) 10-1 to 10-3, the operation depicted in the operation period (1) is performed. The next operation period (6) is a period corresponding to the first half of the sampling cycle n+2. In this period, each control signal is in a state as explained in the operation period (2). The next operation period (7) is a period corresponding to the latter half of the sampling cycle n+2. In this period, each control signal is in a state as explained in the operation period (3). That is, in the operation period (5) and thereafter, the state is repeatedly changed in the order as the operation period (1)→ the operation period (2)→ the operation period (3)→ the operation period (2)→ the operation period (1), and each analog value held in the sampling function units (SC1 to SC3) 10-1 to 10-3 is coupled between the inverting input terminal (−) and the output terminal of the OP amp 11 in time series and is then successively output from the OP amp 11 to the A/D converting unit at the subsequent stage. The foregoing is the operation of the S/H unit 1 depicted in FIG. 2.

As explained above, according to the first embodiment, m equal analog values are converted to m digital signals, and an average value of these m digital signals parallelized is output as a final A/D conversion result. Therefore, noise superposed at the S/H unit is also subjected to averaging. With this, the level of noise power in the output digital signal can be reduced by $10 \times \text{Log}_{10}(1/m)$ decibels. For example, as depicted in FIG. 4, when m=2, the level of noise power can be reduced by 3 decibels. Therefore, a high SNR can be easily achieved even under a low voltage where it is difficult to ensure a signal amplitude.

Here, the A/D converter is configured of one S/H unit, one A/D converting unit, one data-alignment adjusting circuit, and an averaging circuit. Therefore, noise power can be reduced more compared with the conventional noise-power reducing method without increasing area occupancy and power consumption of the A/D converter.

Also, one S/H unit is configured of m+1 sampling function units and one OP amp. Among these m+1 sampling function units, m sampling function units repeat the operation of sampling an input analog signal at the same timing with the respective control signals, sequentially coupling the held analog values one by one to the OP amp and, with the combination of these m sampling function units being changed at the timing of coupling the last analog value to the OP amp, sampling an input analog signal at the same timing with the respective control signals. Therefore, m equal analog values at the respective sampling timings can be output one by one without intermission from the OP amp to the A/D converting unit. In the A/D converting unit, m digital signals for m equal analog values at the respective sampling timings can be reliably generated without intermission.

Second Embodiment

Figure 5:
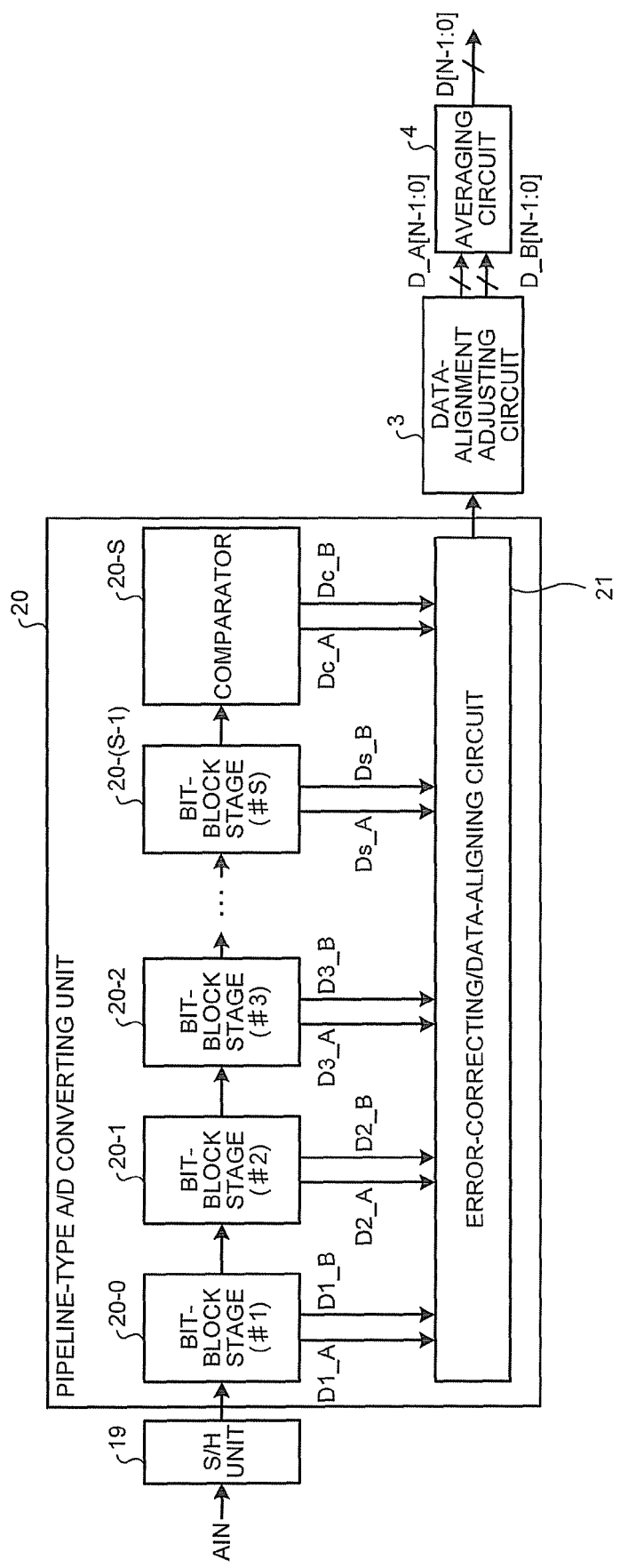
FIG. 5 is a block diagram of the configuration of an A/D converter according to a second embodiment of the present invention.

FIG. 5 is a block diagram of the configuration of an A/D converter according to a second embodiment of the present invention. In the second embodiment, an example of configuration is explained in which a S/H unit provided preceding a pipeline-type A/D converting unit of a general pipeline-type A/D converter is replaced by the S/H unit 1 depicted in FIG. 1 (first embodiment).

That is, as depicted in FIG. 5, the A/D converter according to the second embodiment includes an S/H unit 19, a pipeline-type A/D converting unit 20, the data-alignment adjusting circuit 3, and the averaging circuit 4. In the second embodiment, for convenience of explanation, a case of m=2 is explained.

The S/H unit 19, although its reference numeral is changed for convenience of explanation, has a configuration similar to that of the S/H unit 1 depicted in FIG. 1 (first embodiment). When m=2, with the configuration depicted in FIG. 3, the S/H unit 19 samples and holds an analog value for Ach and an analog value for Bch from an input analog signal AIN, and then output these values to the pipeline-type A/D converter 20 in sequence.

The pipeline-type A/D converter 20 is a circuit portion in a general pipeline-type A/D converter for conversion to a digital signal sequentially from the most significant bit through pipeline processing, and includes, as main components, a pipeline stage formed of cascaded bit-block stages (#1 to #S) 20-0 to 20-(S−1) and a comparator 20-S, and an error-correcting/data-aligning circuit 21.

Figure 8:
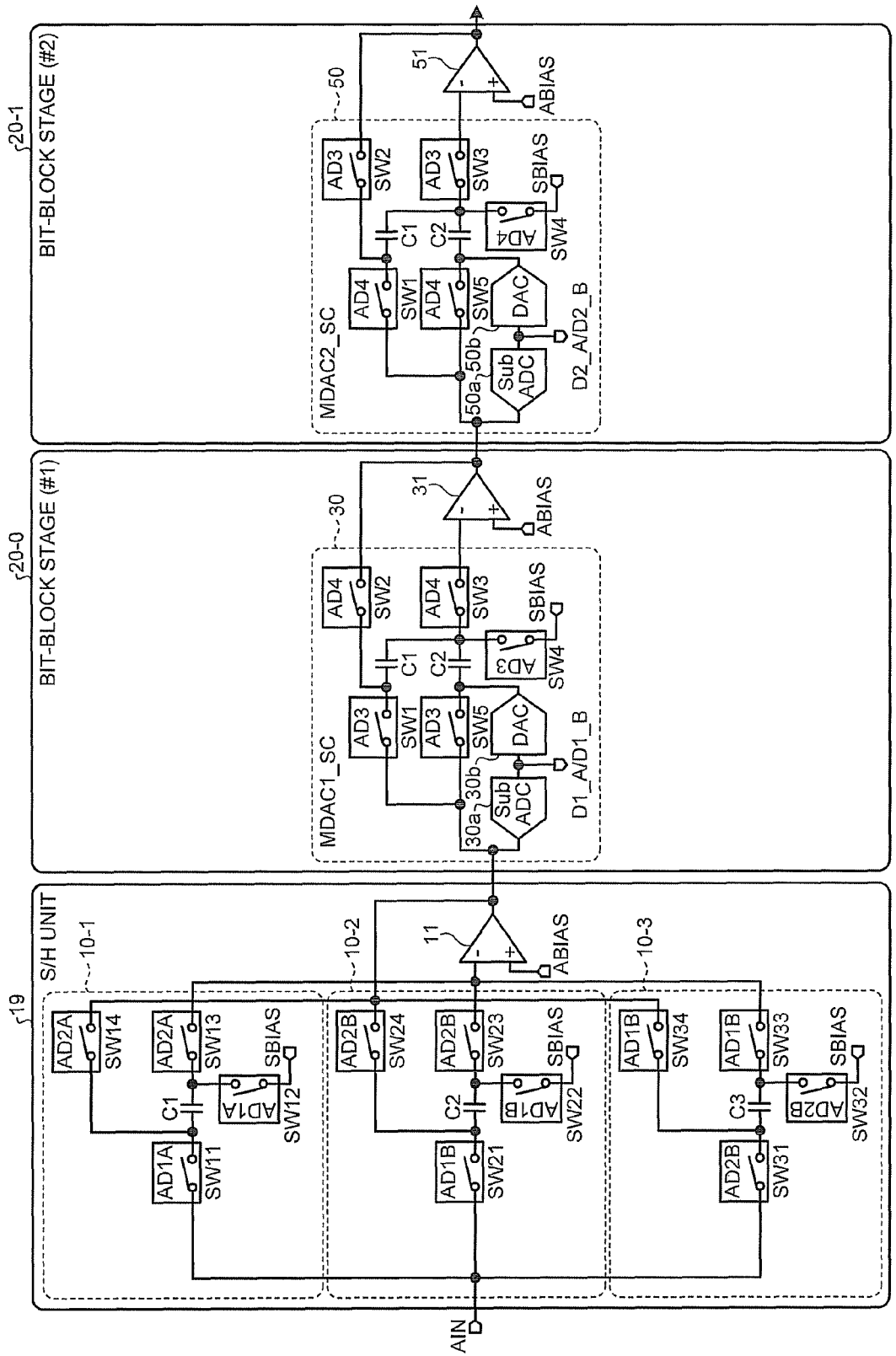
FIG. 8 is a circuit diagram of a second example of configuration of the S/H unit and the pipeline stage of the pipeline-type A/D converting unit depicted in FIG. 5.

When m=2, from the analog values for Ach and Bch input from the S/H unit 19, the bit-block stages (#1 to #S) 20-0 to 20-(S-1) and the comparator 20-S of the pipeline-type A/D converting unit 20 generate data D1_A to Ds_A and Dc_A for Ach and D1_B to Ds_B and Dc_B for Bch in sequence for output to the error-correcting/data-aligning circuit 21. The error-correcting/data-aligning circuit 21 performs error correction on these Ach data and Bch data, aligns them to generate an N-bit digital signal D_A[N-1:0] for Ach and an N-bit digital signal D_B[N-1:0] for Bch, and then outputs these signals to the data-alignment adjusting circuit 3 in sequence. The N-bit digital signals D_A[N-1:0] for Ach and D_B[N-1:0] for Bch are A/D conversion results of the analog signal AIN sampled at the same time, and noise signals included in these conversion results are independent. Therefore, through averaging at the averaging circuit 4, an A/D conversion result can be obtained with noise power reduced. The pipeline stage of this pipeline-type A/D converting unit 20 is configured as depicted in FIGS. 6 and 8.

(A) A first example of configuration of the S/H unit and the pipeline-type A/D converting unit depicted in FIG. 5 and their operation are now explained with reference to FIGS. 6 and 7. FIG. 6 is a circuit diagram of the first example of configuration of the S/H unit and the pipeline stage of the pipeline-type A/D converting unit depicted in FIG. 5. FIG. 7 is a timing chart for explaining the operation of the S/H unit and the pipeline stage of the pipeline-type A/D converting unit depicted in FIG. 6.

Figure 6:
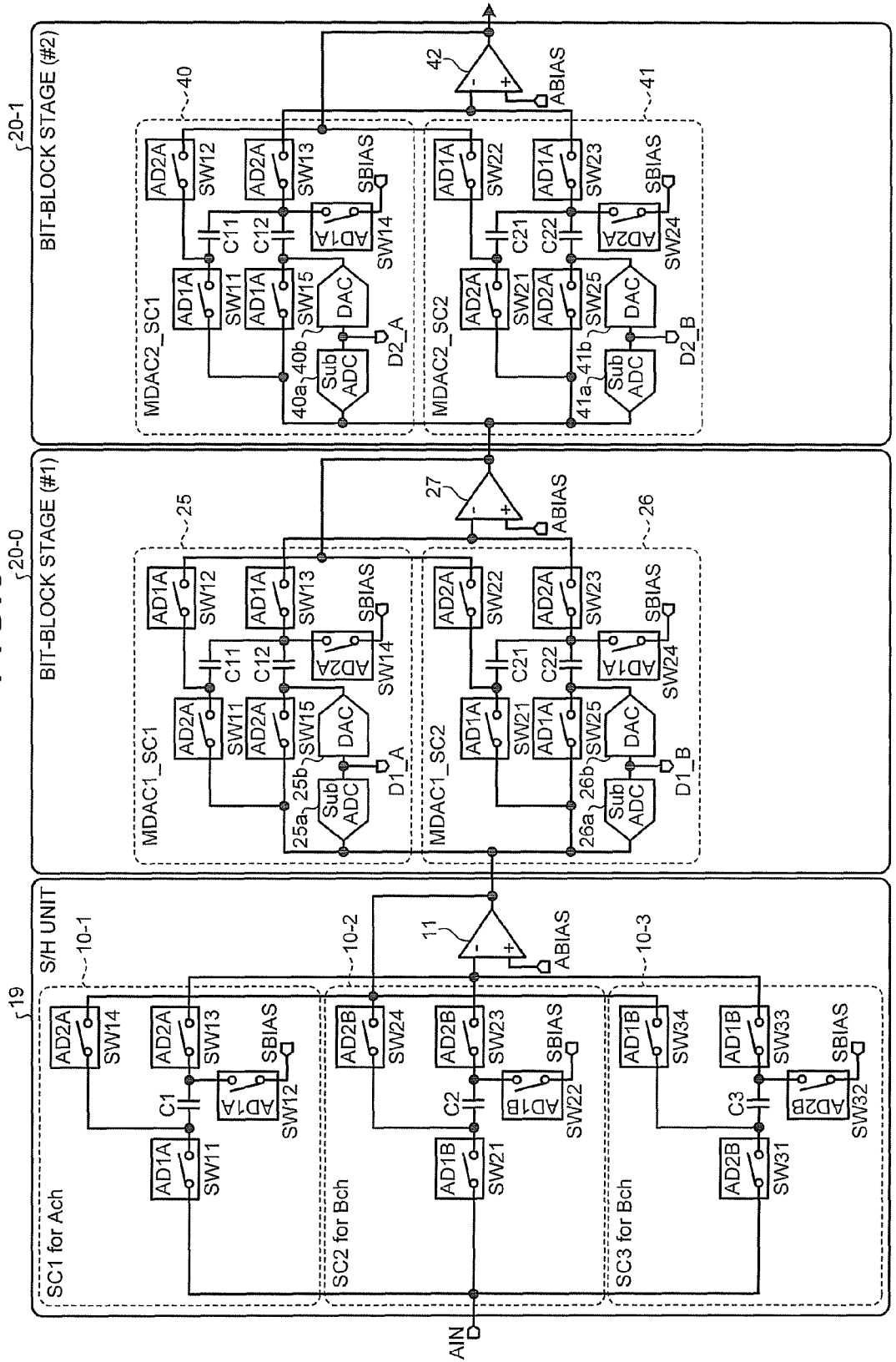
FIG. 6 is a circuit diagram of a first example of configuration of a S/H unit and a pipeline stage of a pipeline-type A/D converting unit depicted in FIG. 5.
Figure 7:
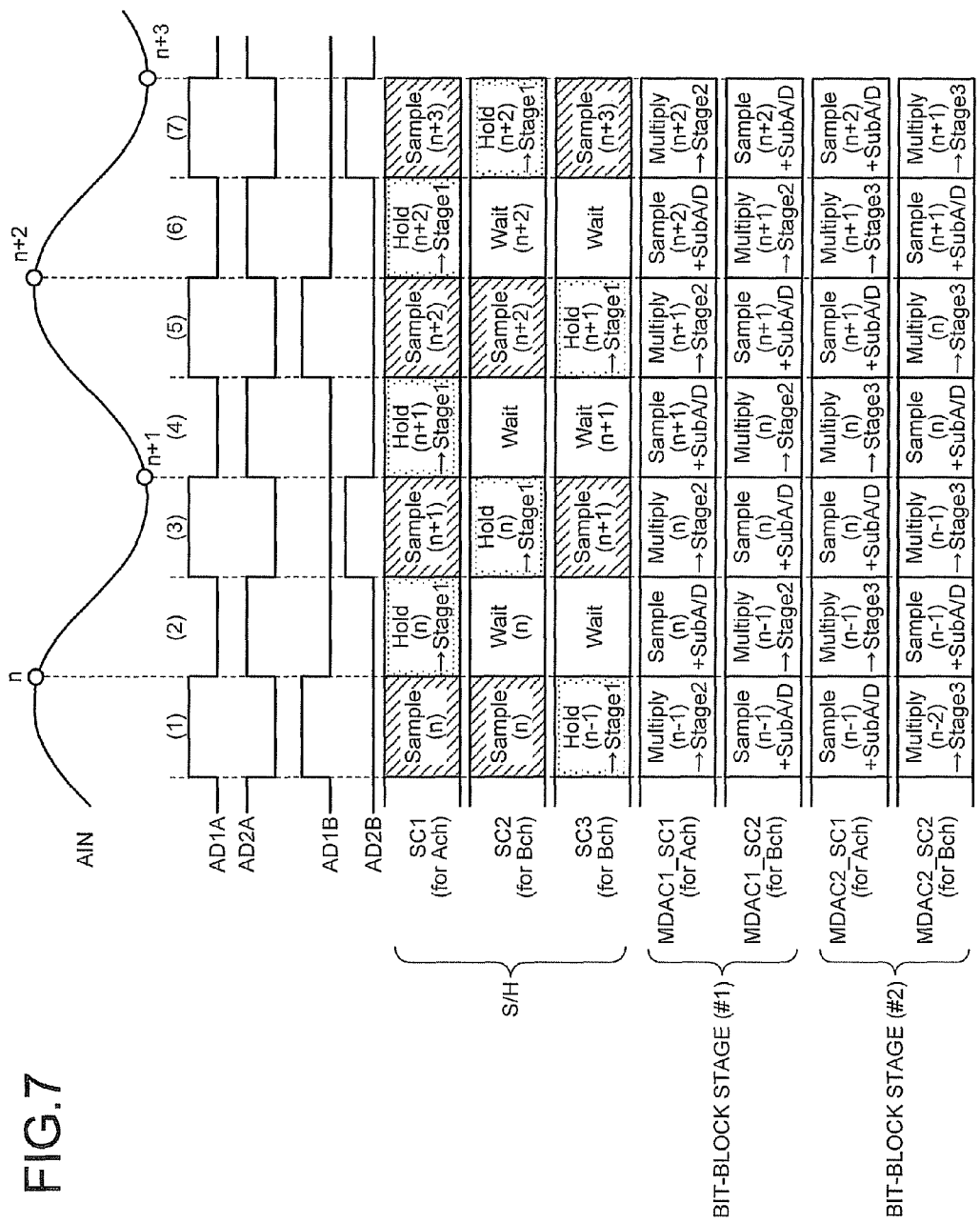
FIG. 7 is a timing chart for explaining the operation of the S/H unit and the pipeline stage of the pipeline-type A/D converting unit depicted in FIG. 6.

In FIG. 6, the S/H unit 19 where the analog signal AIN is input includes, when m=2, the sampling function units (SC1 to SC3) 10-1 to 10-3 and the OP amp 11 depicted in FIG. 3. Among these components, the sampling function unit (SC1) 10-1 is for Ach, while the sampling function unit (SC2) 10-2 and the sampling function unit (SC3) 10-3 are for Bch. Details about control signals for opening and closing switches SW are similar to those depicted in FIG. 4, except their reference characters are changed from Sxx to ADxx. That is, the switches SW11 and SW12 are subjected to open/close control with a control signal AD1A; the switches SW13 and SW14 are subjected to open/close control with a control signal AD2A; the switches SW21, SW22, SW33, and SW34 are subjected to open/close control with a control signal AD1B; and the switches SW23, SW24, SW31, and SW32 are subjected to open/close control with a control signal AD2B.

Also, although FIG. 6 depicts the pipeline stage of the pipeline-type A/D converting unit 20 including the bit-block stage (#1) 20-0 at the first stage and the bit-block stage (#1) 20-1 at the second stage, the third and thereafter to the bit-block stage (#S) 20-(S-1) each similarly include two multiplying Digital-to-Analog (D/A) converting/sampling function units (MDAC_SC) disposed in parallel and one OP amp. A specific configuration is explained below.

The bit-block stage (#1) 20-0 at the first stage includes two multiplying D/A converting/sampling function units (MDAC1_SC1, MDAC1_SC2) 25 and 26 having the same configuration and receiving an output from the S/H unit 19 in parallel, and one OP amp 27. A non-inverting input terminal (+) of the OP amp 27 is supplied with an amp bias ABIAS.

The multiplying D/A converting/sampling function unit (MDAC1_SC1) 25 includes switches SW11, SW12, SW13, SW14, and SW15, capacitative elements C11 and C12, a sub-A/D converter (subADC) 25*a*, and a D/A converter (DAC) 25*b*. An output (ADIN) from the S/H unit 19 is input to one end of the switches SW11 and SW15, and the sub-A/D converter 25*a*. An output terminal of the sub-A/D converter 25*a* is connected to an input terminal of the D/A converter 25*b* and the error-correcting/data-aligning circuit 21. The other end of the switch SW11 is connected to one end of the switch SW12 and one end of the capacitative element C11. The other end of the switch SW12 is connected to an output terminal of the OP amp 27. The other end of the switch SW15 and an output terminal of the D/A converter 25*b* are connected to one end of the capacitative element C12. The other ends of the capacitative elements C11 and C12 are commonly connected to one end of the switches SW13 and SW14. The other end of the switch SW13 is connected to an inverting input terminal (−) of the OP amp 27. The other end of the switch SW14 is supplied with a sampling bias SBIAS. The switches SW11, SW14, and SW15 are subjected to open/close control with the control signal AD2A. The switches SW12 and SW13 are subjected to open/close control with the control signal AD1A.

The multiplying D/A converting/sampling function unit (MDAC1_SC2) 26 includes switches SW21, SW22, SW23, SW24, and SW25, capacitative elements C21 and C22, a sub-A/D converter (subADC) 26*a*, and a D/A converter (DAC) 26*b*. An output (ADIN) from the S/H unit 19 is input to one end of the switches SW21 and SW25, and the sub-A/D converter 26*a*. An output terminal of the sub-A/D converter 26*a* is connected to an input terminal of the D/A converter 26*b* and the error-correcting/data-aligning circuit 21. The other end of the switch SW21 is connected to one end of the switch SW22 and one end of the capacitative element C21. The other end of the switch SW22 is connected to the output terminal of the OP amp 27. The other end of the switch SW25 and an output terminal of the D/A converter 26*b* are connected to one end of the capacitative element C22. The other ends of the capacitative elements C21 and C22 are commonly connected to one end of the switches SW23 and SW24. The other end of the switch SW23 is connected to the inverting input terminal (−) of the OP amp 27. The other end of the switch SW24 is supplied with a sampling bias SBIAS. The switches SW21, SW24, and SW25 are subjected to open/close control with the control signal AD1A. The switches SW22 and SW23 are subjected to open/close control with the control signal AD2A.

The bit-block stage (#2) 20-1 at the second stage includes two multiplying D/A converting/sampling function units (MDAC2_SC1, MDAC2_SC2) 40 and 41 having the same configuration and receiving an output from the bit-block stage (#1) 20-0 in parallel, and one OP amp 42. A non-inverting input terminal (+) of the OP amp 42 is supplied with an amp bias ABIAS.

The multiplying D/A converting/sampling function unit (MDAC2_SC1) 40 includes switches SW11, SW12, SW13, SW14, and SW15, capacitative elements C11 and C12, a sub-A/D converter (subADC) 40*a*, and a D/A converter (DAC) 40*b*. The connection relation among these components is similar to that of the multiplying D/A converting/sampling function unit (MDAC1_SC1) 25 of the bit-block stage (#1) 20-0. However, control signals to the switches SW are different. That is, the switches SW11, SW14, and SW15 are subjected to open/close control with the control signal AD1A, while the switches SW12 and SW13 are subjected to open/close control with the control signal AD2A.

The multiplying D/A converting/sampling function unit (MDAC2_SC2) 41 includes switches SW21, SW22, SW23, SW24, and SW25, capacitative elements C21 and C22, a sub-A/D converter (subADC) 41*a*, and a D/A converter (DAC) 41*b*. The connection relation among these components is similar to that of the multiplying D/A converting/sampling function unit (MDAC1_SC2) 26 of the bit-block stage (#1) 20-0. However, control signals to the switches SW are different. That is, the switches SW21, SW24, and SW25 are subjected to open/close control with the control signal AD2A, while the switches SW22 and SW23 are subjected to open/close control with the control signal AD1A.

Next, the operation is explained with reference to FIG. 7, which depicts a waveform of the analog signal AIN input to the S/H unit 19, waveforms of the control signals AD1A, AD2A, AD1B, and AD2B for open/close control over the switches SW, and the operation at the S/H unit 19 and the two bit-block stages depicted in FIG. 6. A timing relation among the timings n, n+1, n+2, and n+3 indicated on the waveform of the analog signal AIN and the control signals AD1A, AD2A, AD1B, and AD2B is as explained with reference to FIG. 4, and the operation periods (1) to (7) are defined similarly. Note that while all of the control signals AD1A, AD2A, AD1B, and AD2B are applied to the S/H unit 19, only the control signals AD1A and AD2A are applied to the bit-block stages.

[Operation of the S/H Unit 19]

The operation of the S/H unit 19 is as explained with reference to FIG. 4. Here, the operation periods (1) to (7) are briefly explained.

Operation Period (1)

In the sampling function unit (SC1) 10-1, a sampling operation to the capacitative element C1 is performed. At the timing n, an analog value (n) for Ach is held in the capacitative element C1. In the sampling function unit (SC2) 10-2, a sampling operation to the capacitative element C2 is performed. At the timing n, an analog value (n) for Bch is held in the capacitative element C2. In the sampling function unit (SC3) 10-3, an analog value (n−1) for Bch held in the capacitative element C3 at the previous timing n−1 is output to the bit-block stage (#1) 20-0 at the first stage during the present period.

Operation Period (2)

In the sampling function unit (SC1) 10-1, the analog value (n) for Ach held in the capacitative element C1 at the timing n is output to the bit-block stage (#1) 20-0 at the first stage. The sampling function unit (SC2) 10-2 becomes in a wait state Wait (n) while holding the analog value (n) for Bch in the capacitative element C2. The sampling function unit (SC3) 10-3 becomes in a wait state Wait without any analog value to be held in the capacitative element C3.

Operation Period (3)

In the sampling function unit (SC1) 10-1, a sampling operation to the capacitative element C1 is performed. At the timing n+1, an analog value (n+1) for Ach is held in the capacitative element C1. In the sampling function unit (SC2) 10-2, the analog value (n) for Bch held in the capacitative element C2 is output to the bit-block stage (#1) 20-0 at the first stage. In the sampling function unit (SC3) 10-3, a sampling operation to the capacitative element C3 is performed. At the timing n+1, an analog value (n+1) for Bch is held in the capacitative element C3.

Operation Period (4)

In the sampling function unit (SC1) 10-1, the analog value (n+1) for Ach held in the capacitative element C1 at the timing n+1 is output to the bit-block stage (#1) 20-0 at the first stage. The sampling function unit (SC2) 10-2 becomes in a wait state Wait without any analog value to be held in the capacitative element C2. The sampling function unit (SC3) 10-3 becomes in a wait state Wait (n+1) while holding the analog value (n+) for Bch in the capacitative element C3.

Operation Period (5)

In the sampling function unit (SC1) 10-1, a sampling operation to the capacitative element C1 is performed. At the timing n+2, an analog value (n+2) for Ach is held in the capacitative element C1. In the sampling function unit (SC2) 10-2, a sampling operation to the capacitative element C2 is performed. At the timing n+2, the analog value (n+2) for Bch is held in the capacitative element C2. In the sampling function unit (SC3) 10-3, at the timing n+2, the analog value (n+1) for Bch held in the capacitative element C3 at the previous timing n+1 is output to the bit-block stage (#1) 20-0 at the first stage.

Operation Period (6)

In the sampling function unit (SC1) 10-1, the analog value (n+2) for Ach held in the capacitative element C1 at the timing n+2 is output to the bit-block stage (#1) 20-0 at the first stage. The sampling function unit (SC2) 10-2 becomes in a wait state Wait (n+2) while holding the analog value (n+2) for Bch in the capacitative element C2. The sampling function unit (SC3) 10-3 becomes in a wait state Wait without any analog value to be held in the capacitative element C3.

Operation Period (7)

In the sampling function unit (SC1) 10-1, a sampling operation to the capacitative element C1 is performed. At a timing n+3, an analog value (n+3) for Ach is held in the capacitative element C1. In the sampling function unit (SC2) 10-2, the analog value (n+2) for Bch held in the capacitative element C2 is output to the bit-block stage (#1) 20-0 at the first stage. In the sampling function unit (SC3) 10-3, a sampling operation to the capacitative element C3 is performed. At the timing n+3, the analog value (n+3) for Bch is held in the capacitative element C3.

[Operation of the Bit-Block Stage (#1) 20-0]

In the operation period (1), the control signal AD1A is in an ON state, while the control signal AD2A is in an OFF state. That is, in the multiplying D/A converting/sampling function unit (MDAC1_SC1) 25, the switches SW11, SW14, and SW15 are in an open-circuit state, while the switches SW12 and SW13 are in a closed-circuit state. Also, in the multiplying D/A converting/sampling function unit (MDAC1_SC2) 26, the switches SW21, SW24, and SW25 are in a closed-circuit state, while the switches SW22 and SW23 are in an open-circuit state.

Therefore, in the multiplying D/A converting/sampling function unit (MDAC1_SC1) 25, while the control signal AD1A is in an ON state, an adding/subtracting process by the D/A converter 25b via the capacitative element C12 according to a conversion result D1_A by the sub-A/D converter 25a obtained at the previous timing n−1 and a multiplying process by a predetermined factor ((C11+C12)/C11) determined by a capacitance ratio between the capacitative elements C11 and C12 are performed on the analog value (n−1) held in the capacitative elements C11 and C12 at the previous timing n−1. Then, the process result is output from the OP amp 27 to the bit-block stage (#2) 20-1 as an analog value (n−1) after the adding/subtracting process for Ach.

Also, in the multiplying D/A converting/sampling function unit (MDAC1_SC2) 26, a sampling operation is performed on the capacitative elements C21 and C22 for the analog value (n−1) for Bch input from the S/H unit 19, and the analog value (n−1) is held in the capacitative elements C21 and C22 at the timing n when the control signal AD1A is turned OFF. Concurrently, in the sub-A/D converter 26a, a logical value of the most significant bit is determined for the analog value (n−1) for Bch input from the S/H unit 19. Then, data D1_B for Bch is output to the D/A converter 26b and the error-correcting/data-aligning circuit 21.

In the next operation period (2), the control signal AD1A is in an OFF state, while the control signal AD2A is in an ON state. That is, in the multiplying D/A converting/sampling function unit (MDAC1_SC1) 25, the switches SW11, SW14, and SW15 are in a closed-circuit state, while the switches SW12 and SW13 are in an open-circuit state. Also, in the multiplying D/A converting/sampling function unit (MDAC1_SC2) 26, the switches SW21, SW24, and SW25 are in an open-circuit state, while the switches SW22 and SW23 are in a closed-circuit state.

Therefore, in the multiplying D/A converting/sampling function unit (MDAC1_SC1) 25, a sampling operation is performed on the capacitative elements C11 and C12 for the analog value (n) for Ach input from the S/H unit 19, and the analog value (n) is held in the capacitative elements C11 and C12 at the timing when the control signal AD2A is turned OFF. Concurrently, in the sub-A/D converter 25a, a logical value of the most significant bit is determined for the analog value (n) for Ach input from the S/H unit 19. Then, data D1_A for Ach is output to the D/A converter 25b and the error-correcting/data-aligning circuit 21.

Also, in the multiplying D/A converting/sampling function unit (MDAC1_SC2) 26, while the control signal AD2A is in an ON state, an adding/subtracting process by the D/A converter 26b via the capacitative element C22 according to the conversion result D1_A by the sub-A/D converter 26a obtained at the previous timing n−1 and a multiplying process by a predetermined factor ((C21+C22)/C21) determined by a capacitance ratio between the capacitative elements C21 and C22 are performed on the analog value (n−1) held in the capacitative elements C21 and C22 at the timing n. Then, the process result is output from the OP amp 27 to the bit-block stage (#2) 20-1 as an analog value (n−1) after the adding/subtracting process for Bch.

In the following operation periods (3), (5), and (7), as with the operation period (1), the control signal AD1A is in an ON state, while the control signal AD2A is in an OFF state. Also, in the operation periods (4) and (6), as with the operation period (2), the control signal AD1A is in an OFF state, while the control signal AD2A is in an ON state. That is, in the operation period (3) and thereafter, the operation in the operation period (1) and the operation in the operation period (2) are alternately repeated. As such, in the multiplying D/A converting/sampling function unit (MDAC1_SC1) 25 and the multiplying D/A converting/sampling function unit (MDAC1_SC2) 26, the data D1_A for Ach and the data D1_B for Bch are alternately generated within one sampling cycle.

[Operation of the Bit-Block Stage (#2) 20-1]

In the operation period (1), the control signal AD1A is in an ON state, while the control signal AD2A is in an OFF state. That is, in the multiplying D/A converting/sampling function unit (MDAC2_SC1) 40, the switches SW11, SW14, and SW15 are in a closed-circuit state, while the switches SW12 and SW13 are in an open-circuit state. Also, in the multiplying D/A converting/sampling function unit (MDAC2_SC2) 41, the switches SW21, SW24, and SW25 are in an open-circuit state, while the switches SW22 and SW23 are in a closed-circuit state.

Therefore, in the multiplying D/A converting/sampling function unit (MDAC2_SC1) 40, a sampling operation is performed on the capacitative elements C11 and C12 for the analog value (n−1) for Ach input from the bit-block stage (#1) 20-0, and the analog value (n−1) is held in the capacitative elements C11 and C12 at the timing n. Concurrently, in the sub-A/D converter 40a, a logical value of a (most significant bit-1) bit is determined for the analog value (n−1) for Ach input from the bit-block stage (#1) 20-0. Then, data D2_A for Ach is output to the D/A converter 40b and the error-correcting/data-aligning circuit 21.

Also, in the multiplying D/A converting/sampling function unit (MDAC2_SC2) 41, while the control signal AD1A is in an ON state, an adding/subtracting process by the D/A converter 41b via the capacitative element C22 according to a conversion result D2_B by the sub-A/D converter 41a obtained at the second previous timing n−2 and a multiplying process by the predetermined factor ((C21+C22)/C21) determined by the capacitance ratio between the capacitative elements C21 and C22 are performed on the second previous timing n−2. Then, the process result is output from the OP amp 42 to a bit-block stage (#3) 20-2 not shown as an analog value (n−2) after the adding/subtracting process for Bch.

In the next operation period (2), the control signal AD1A is in an OFF state, while the control signal AD2A is in an ON state. That is, in the multiplying D/A converting/sampling function unit (MDAC2_SC1) 40, the switches SW11, SW14, and SW15 are in an open-circuit state, while the switches SW12 and SW13 are in a closed-circuit state. Also, in the multiplying D/A converting/sampling function unit (MDAC2_SC2) 41, the switches SW21, SW24, and SW25 are in a closed-circuit state, while the switches SW22 and SW23 are in an open-circuit state.

Therefore, in the multiplying D/A converting/sampling function unit (MDAC2_SC1) 40, while the control signal AD2A is in an ON state, an adding/subtracting process by the D/A converter 40b via the capacitative element C12 according to a conversion result D2_A by the sub-A/D converter 40a obtained at the previous timing n−1 and a multiplying process by the predetermined factor ((C11+C12)/C11) determined by the capacitance ratio between the capacitative elements C11 and C12 are performed on the analog value (n−1) held in the capacitative elements C11 and C12 at the timing n. Then, the process result is output from the OP amp 42 to the bit-block stage (#3) 20-2 not shown as an analog value (n−1) after the adding/subtracting process for Ach.

Furthermore, in the multiplying D/A converting/sampling function unit (MDAC2_SC2) 41, a sampling operation is performed on the capacitative elements C21 and C22 for the analog value (n−1) for Bch input from the bit-block stage (#1) 20-0, and the analog value (n−1) is held in the capacitative elements C21 and C22 at the timing when the control signal AD2A is turned OFF. Concurrently, in the sub-A/D converter 41a, a logical value of the second bit is determined for the analog value (n−1) for Bch input from the bit-block stage (#1) 20-0. Then, data D2_B for Bch is output to the D/A converter 41b and the error-correcting/data-aligning circuit 21.

In the following operation periods (3), (5), and (7), as with the operation period (1), the control signal AD1A is in an ON state, while the control signal AD2A is in an OFF state. Also, in the operation periods (4) and (6), as with the operation period (2), the control signal AD1A is in an OFF state, while the control signal AD2A is in an ON state. That is, in the operation period (3) and thereafter, the operation in the operation period (1) and the operation in the operation period (2) are alternately repeated. As such, in the multiplying D/A converting/sampling function unit (MDAC2_SC1) 40 and the multiplying D/A converting/sampling function unit (MDAC2_SC2) 41, the data D2_A for Ach and the data D2_B for Bch are alternately generated within one sampling cycle.

The foregoing operation is performed up to the bit-block stage (#S) 20-(S-1). Then, the result of determining a logical value on the final bit at the comparator 20-S and the logical value determined by each bit-block stage are subjected to error-correction and data alignment in the error-correcting/data aligning circuit 21. Then, after the timing is adjusted by the data-alignment adjusting circuit 3, N-bit digital signals D_A[N-1:0] and D_B[N-1:0] are obtained for Ach and Bch, respectively. These N-bit digital signals D_A[N-1:0] for Ach and D_B[N-1:0] for Bch are A/D conversion results of the analog signal AIN sampled at the same time, and noise signals included in these conversion results are independent. Therefore, through averaging at the averaging circuit 4, a final A/D conversion result can be obtained with noise power reduced.

In the conventional general pipeline-type A/D converter, the OP amp at each pipeline stage is configured to merely consume power without performing a transfer operation to the next stage while the control signal AD1A is in an ON state where a sampling operation is performed, and perform a transfer operation to the next stage while the control signal AD1A is in an OFF state. Therefore, if two conventional general pipeline-type A/D converters are disposed in parallel for use, power consumption is doubled.

By contrast, in the first configuration example depicted in FIG. 6, each stage of the pipeline-type A/D converting unit has a configuration where two multiplying D/A converting/sampling function units (MDAC_SC) are disposed in parallel, but only one OP amp is provided at each stage. Also, the OP amp at each stage performs a transfer operation to the next stage while the control signal AD1A is both in an ON stage and an OFF stage. Therefore, power consumption can be equal to that in the case of one pipeline-type A/D converter. That is, power consumption can be reduced.

Figure 9:
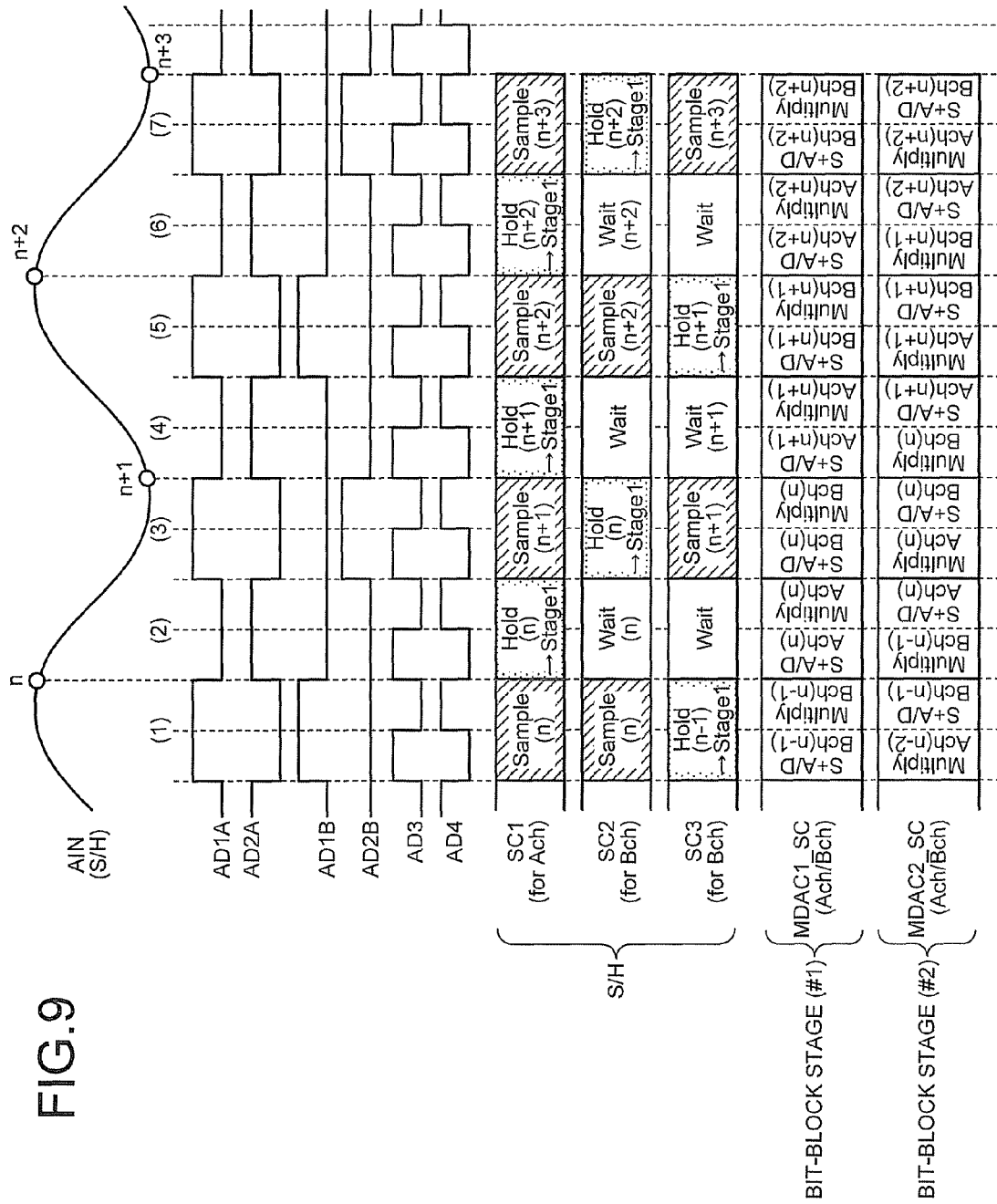
FIG. 9 is a timing chart for explaining the operation of the S/H unit and the pipeline stage of the pipeline-type A/D converting unit depicted in FIG. 8.

(B) Next, a second example of configuration of the S/H unit and the pipeline-type A/D converting unit depicted in FIG. 5 and their operation are now explained with reference to FIGS. 8 and 9. FIG. 8 is a circuit diagram of the second example of configuration of the S/H unit and the pipeline stage of the pipeline-type A/D converting unit depicted in FIG. 5. FIG. 9 is a timing chart for explaining the operation of the S/H unit and the pipeline stage of the pipeline-type A/D converting unit depicted in FIG. 8.

As with FIG. 6, although FIG. 8 depicts the pipeline stage of the pipeline-type A/D converting unit 20, where an output from the S/H unit 19 is input, including the bit-block stage (#1) 20-0 at the first stage and the bit-block stage (#1) 20-1 at the second stage, the third and thereafter to the bit-block stage (#S) 20-(S-1) each similarly include one multiplying D/A converting/sampling function unit (MDAC_SC) and one OP amp. A specific configuration is explained below.

The bit-block stage (#1) 20-0 at the first stage includes one multiplying D/A converting/sampling function unit (MDAC1_SC) 30, where an output from the S/H unit 19 is input, and one OP amp 31. A non-inverting input terminal (+) of the OP amp 31 is supplied with an amp bias ABIAS.

The multiplying D/A converting/sampling function unit (MDAC1_SC) 30 includes switches SW1, SW2, SW3, SW4, and SW5, capacitative elements C1 and C2, a sub-A/D converter (subADC) 30a, and a D/A converter (DAC) 30b. An output (ADIN) from the S/H unit 19 is input to one end of the switches SW1 and SW5, and the sub-A/D converter 30a. An output terminal of the sub-A/D converter 30a is connected to an input terminal of the D/A converter 30b and the error-correcting/data-aligning circuit 21. The other end of the switch SW1 is connected to one end of the switch SW2 and one end of the capacitative element C1. The other end of the switch SW2 is connected to an output terminal of the OP amp 31. The other end of the switch SW5 and an output terminal of the DAC 30b are connected to one end of the capacitative element C2. The other ends of the capacitative elements C1 and C2 are commonly connected to one end of the switches SW3 and SW4. The other end of the switch SW3 is connected to an inverting input terminal (−) of the OP amp 31. The other end of the switch SW4 is supplied with a sampling bias SBIAS. The switches SW1, SW4, and SW5 are subjected to open/close control with a control signal AD3. The switches SW2 and SW3 are subjected to open/close control with a control signal AD4.

The bit-block stage (#2) 20-1 at the second stage includes one multiplying D/A converting/sampling function unit (MDAC2_SC) 50 receiving an output from the bit-block stage (#1) 20-0, and one OP amp 51. A non-inverting input terminal (+) of the OP amp 51 is supplied with an amp bias ABIAS.

The multiplying D/A converting/sampling function unit (MDAC2_SC) 50 includes switches SW1, SW2, SW3, SW4, and SW5, capacitative elements C1 and C2, a sub-A/D converter (subADC) 53a, and a D/A converter (DAC) 53b. The connection relation among these components is similar to that of the multiplying D/A converting/sampling function unit (MDAC1_SC) 30 of the bit-block stage (#1) 20-0. However, control signals to the switches SW are different. That is, the switches SW1, SW4, and SW5 are subjected to open/close control with the control signal AD4, while the switches SW2 and SW3 are subjected to open/close control with the control signal AD3.

Next, the operation is explained with reference to FIG. 9, which depicts a waveform of the analog signal AIN input to the S/H unit 19, waveforms of the control signals AD1A, AD2A, AD1B, AD2B, AD3, and AD4 for open/close control over the switches, and the operation at the S/H unit 19 and the two bit-block stages depicted in FIG. 8.

The control signals AD1A, AD2A, AD1B, and AD2B are used in the S/H unit 19, and are similar to those depicted in FIG. 7. Here, explanation of the operation of the S/H unit 19 is omitted, and the operation of the bit-block stage (#1) 20-0 and the bit-block stage (#2) 20-1 using the control signals AD3 and AD4 is explained.

As depicted in FIG. 9, the control signal AD3 is to turn ON and OFF in the same time width in an ON period and an OFF period of the control signal AD1A. The control signal AD3 is in an ON state in the first-half period and in an OFF state in the latter-half period throughout the operation periods (1) to (7). The control signal AD4 is a signal obtained through logical inversion of the control signal AD3.

[Operation of the Bit-Block Stage (#1) 20-0]

In the multiplying D/A converting/sampling function unit (MDAC1_SC) 30 of the bit-block stage (#1) 20-0, in the first half of each operation period, the switches SW1, SW4, and SW5 are in a closed-circuit state, while the switches SW2 and SW3 are in an open-circuit state. In the latter-half period, the switches SW1, SW4, and SW5 are in an open-circuit state, while the switches SW2 and SW3 are in a closed-circuit state.

Therefore, in the first half of the operation period (1), a sampling operation is performed on the capacitative elements C1 and C2 for the analog value (n−1) for Bch input from the S/H unit 19, and the analog value (n−1) is held in the capacitative elements C1 and C2 at the timing when the control signal AD3 is turned OFF. Concurrently, in the sub-A/D converter 30a, a logical value of the most significant bit is determined for the analog value (n−1) for Bch input from the S/H unit 19. Then, data D1_B for Bch is output to the D/A converter 30b and the error-correcting/data-aligning circuit 21.

Also, in the latter half of the operation period (1), while the control signal AD4 is in an ON state, an adding/subtracting process by the D/A converter 30b via the capacitative element C2 according to the conversion result D1_B by the sub-A/D converter 30a obtained in the first-half period and a multiplying process by a predetermined factor ((C1+C2)/C1) determined by a capacitance ratio between the capacitative elements C1 and C2 are performed on the analog value (n−1) held in the capacitative elements C1 and C2 in the first-half period. Then, the process result is output from the OP amp 31 to the bit-block stage (#2) 20-1 as an analog value (n−1) after the adding/subtracting process for Bch.

In the first half of the next operation period (2), a sampling operation is performed on the capacitative elements C1 and C2 for the analog value (n) for Ach input from the S/H unit 19, and the analog value (n) is held in the capacitative elements C1 and C2 at the timing when the control signal AD3 is turned OFF. Concurrently, in the sub-A/D converter 30a, a logical value of the most significant bit is determined for the analog value (n) for Ach input from the S/H unit 19. Then, data D1_A for Ach is output to the D/A converter 30b and the error-correcting/data-aligning circuit 21.

Also, in the latter half of the operation period (2), while the control signal AD4 is in an ON state, an adding/subtracting process by the D/A converter 30b via the capacitative element C2 according to the conversion result D1_A by the sub-A/D converter 30a obtained in the first-half period and a multiplying process by the predetermined factor ((C1+C2)/C1) determined by the capacitance ratio between the capacitive elements C1 and C2 are performed on the analog value (n) held in the capacitive elements C1 and C2 in the first-half period. Then, the process result is output from the OP amp 31 to the bit-block stage (#2) 20-1 as an analog value (n) after the adding/subtracting process for Ach.

In the next operation period (3) and thereafter, an operation similar to the above is repeated. As such, in each operation period, the multiplying D/A converting/sampling function unit (MDAC1_SC) 30 of the bit-block stage (#1) 20-0 generates the data D1_A for Ach and the data D1_B for Bch.

[Operation of the Bit-Block Stage (#2) 20-1]

In the multiplying D/A converting/sampling function unit (MDAC2_SC) 50 of the bit-block stage (#2) 20-1, in the first half of each operation period, the switches SW1, SW4, and SW5 are in an open-circuit state, while the switches SW2 and SW3 are in a closed-circuit state. In the latter-half period, the switches SW1, SW4, and SW5 are in a closed-circuit state, while the switches SW2 and SW3 are in an open-circuit state. That is, the operation of the multiplying D/A converting/sampling function unit (MDAC2_SC) 50 proceeds in a manner such that an operation to be performed by the multiplying D/A converting/sampling function unit (MDAC1_SC) 30 during the first half of an operation period is performed in the latter half of that operation period, that is, the operation is performed as being shifted by a half period.

That is, in the first half of the operation period (1), while the control signal AD3 is in an ON state (during the first half of the operation period (1)), an adding/subtracting process by the D/A converter 50b via the capacitive element C2 according to a conversion result D2_A by the sub-A/D converter 50a obtained in the latter half of an operation period immediately previous to the operation period (1) and a multiplying process by a predetermined factor ((C1+C2)/C1) determined by a capacitance ratio between the capacitive elements C1 and C2 are performed on an analog value (n−2) held in the capacitive elements C1 and C2 in the latter-half period. Then, the process result is output from the OP amp 51 to the bit-block stage (#3) 20-2 not shown as an analog value (n−2) after the adding/subtracting process for Ach.

In the latter half of the operation period (1), a sampling operation is performed on the capacitive elements C1 and C2 for the analog value (n−1) for Bch input from the multiplying D/A converting/sampling function unit (MDAC1_SC) 30, and the analog value (n−1) is held in the capacitive elements C1 and C2 at the timing n when the control signal AD4 is turned OFF. Concurrently, in the sub-A/D converter 50a, a logical value of a (most significant bit-1) bit is determined for the analog value (n−1) for Bch input from the multiplying D/A converting/sampling function unit (MDAC1_SC) 30. Then, data D1_B for Bch is output to the D/A converter 50b and the error-correcting/data-aligning circuit 21.

In the first half of the next operation period (2), while the control signal AD3 is in an ON state (during the first half of the operation period (2)), an adding/subtracting process by the D/A converter 50b via the capacitive element C2 according to the conversion result D2_B by the sub-A/D converter 50a obtained in the latter half of the operation period (1) and a multiplying process by the predetermined factor ((C1+C2)/C1) determined by the capacitance ratio between the capacitive elements C1 and C2 are performed on the analog value (n−1) held in the capacitive elements C1 and C2 in the latter-half period. Then, the process result is output from the OP amp 51 to the bit-block stage (#3) 20-2 not shown as an analog value (n−1) after the adding/subtracting process for Bch.

In the latter half of the operation period (2), a sampling operation is performed on the capacitive elements C1 and C2 for the analog value (n) for Ach input from the multiplying D/A converting/sampling function unit (MDAC1_SC) 30, and the analog value (n) is held in the capacitive elements C1 and C2 at the timing when the control signal AD4 is turned OFF (when the latter half of the operation period (2) ends). Concurrently, in the sub-A/D converter 50a, a logical value of a (most significant bit-1) bit is determined for the analog value (n) for Ach input from the multiplying D/A converting/sampling function unit (MDAC1_SC) 30. Then, data D1_A for Ach is output to the D/A converter 50b and the error-correcting/data-aligning circuit 21.

Then, in the first half of the operation period (3), while the control signal AD4 is in an ON state (during the latter half of the operation period (2)), an adding/subtracting process by the D/A converter 50b via the capacitive element C2 according to the conversion result D2_A by the sub-A/D converter 50a obtained in the latter half of the operation period (2) and a multiplying process by the predetermined factor ((C1+C2)/C1) determined by the capacitance ratio between the capacitive elements C1 and C2 are performed on the analog value (n) held in the capacitive elements C1 and C2 in the latter-half of the operation period (2). Then, the process result is output from the OP amp 51 to the bit-block stage (#3) 20-2 not shown as an analog value (n) after the adding/subtracting process for Bch.

In the latter half of the next operation period (3) and thereafter, the following operation is similarly performed in the latter half of the operation period (3) and the first half of the operation period (4), in the latter half of the operation period (4) and the first half of the operation period (5), in the latter half of the operation period (5) and the first half of the operation period (6), and in the latter half of the operation period (6) and the first half of the operation period (7), a sampling operation and a bit-determination operation are performed in the latter-half period, while a transfer operation to the next stage is performed in the first-half period. As such, in the multiplying D/A converting/sampling function unit (MDAC2_SC) 50 at the bit-block stage (#2) 20-1, the operation to be performed by the multiplying D/A converting/sampling function unit (MDAC1_SC) 30 at the previous stage is performed as being shifted by a half period, thereby generating data D2_A for Ach and data D2_B for Bch.

As explained above, in the second configuration example depicted in FIG. 8, each stage is configured of one multiplying D/A converting/sampling function unit and one OP amp, but a converting operation is performed at a speed twice as high as that of the control signal AD1A defining the operation of the S/H unit. Therefore, as with the first configuration example in which two multiplying D/A converting/sampling function units are provided in parallel, data for Ach and data for Bch can be output. In this case, the OP amp at each stage successively handles signals of the same value, and therefore it can be assumed that a necessary current is not doubled.

Third Embodiment

Figure 10:
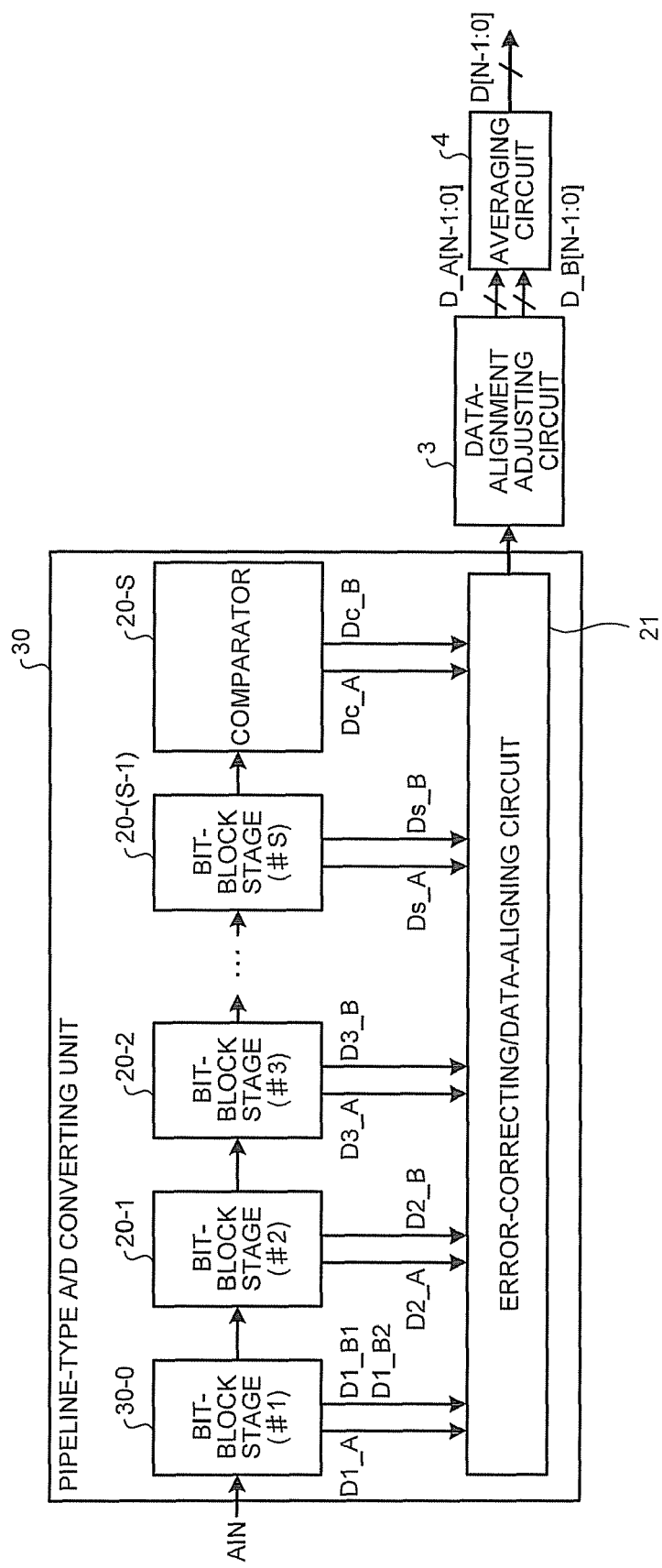
FIG. 10 is a block diagram of the configuration of an A/D converter according to a third embodiment of the present invention.

FIG. 10 is a block diagram of the configuration of an A/D converter according to a third embodiment of the present invention. In the third embodiment, an example of configuration is depicted in which a S/H unit provided at a stage immediately previous to a pipeline-type A/D converting unit of a general pipeline-type A/D converter is deleted and the S/H unit 1 depicted in FIG. 1 (first embodiment) is incorporated in the first stage of an A/D converting unit performing pipeline processing. Note that, as with FIG. 5 (second embodiment), the case of m=2 is explained in the third embodiment.

That is, as depicted in FIG. 10, an A/D converter according to the third embodiment is configured in a manner such that, in the configuration depicted in FIG. 5 (second embodiment), the S/H unit 19 is deleted, the pipeline-type A/D converting unit 20 is replaced by a pipeline-type A/D converting unit 30, and an analog signal AIN is directly input to the pipeline-type A/D converting unit 30.

The pipeline-type A/D converting unit 30 has a configuration such that, in the pipeline-type A/D converting unit 20 depicted in FIG. 5 (second embodiment), only the bit-block stage (#1) 20-0 at the first stage is replaced by a bit-block stage (#1) 30-0 according to the third embodiment.

When m=2, the bit-block stage (#1) 30-0 at the first stage performs a sampling operation similar to that of the S/H unit 19 depicted in FIG. 5 on the input analog signal AIN. Also, the bit-block stage (#1) 30-0 generates data D1_A for Ach and data D1_B1 and D1_B2 for Bch each by determining a logical value of the most significant bit from the input analog signal AIN, and then output the generated data to the error-correcting/data-aligning circuit 21.

Figure 11:
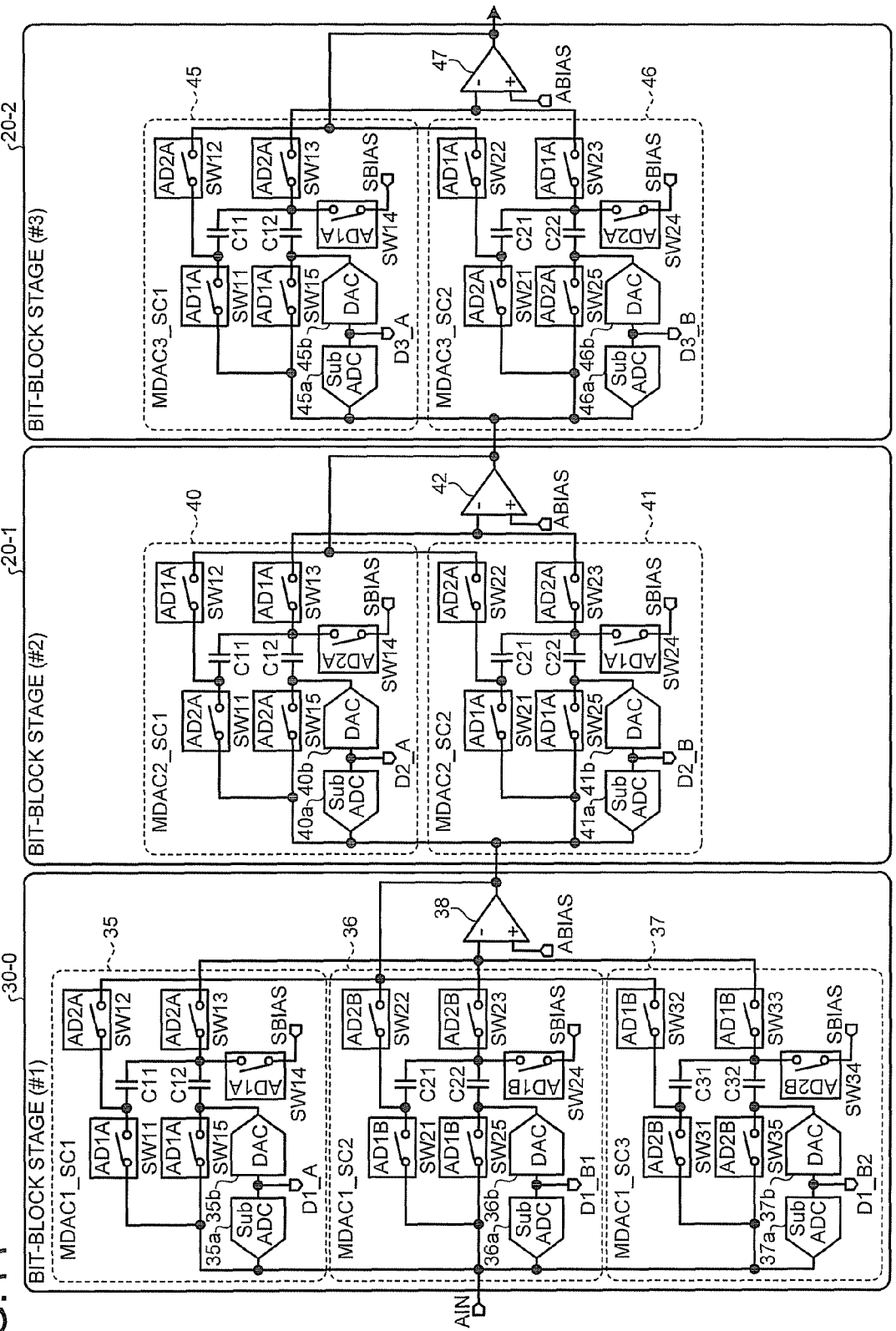
FIG. 11 is a circuit diagram of a first example of configuration of a pipeline stage of a pipeline-type A/D converting unit depicted in FIG. 10.
Figure 12:
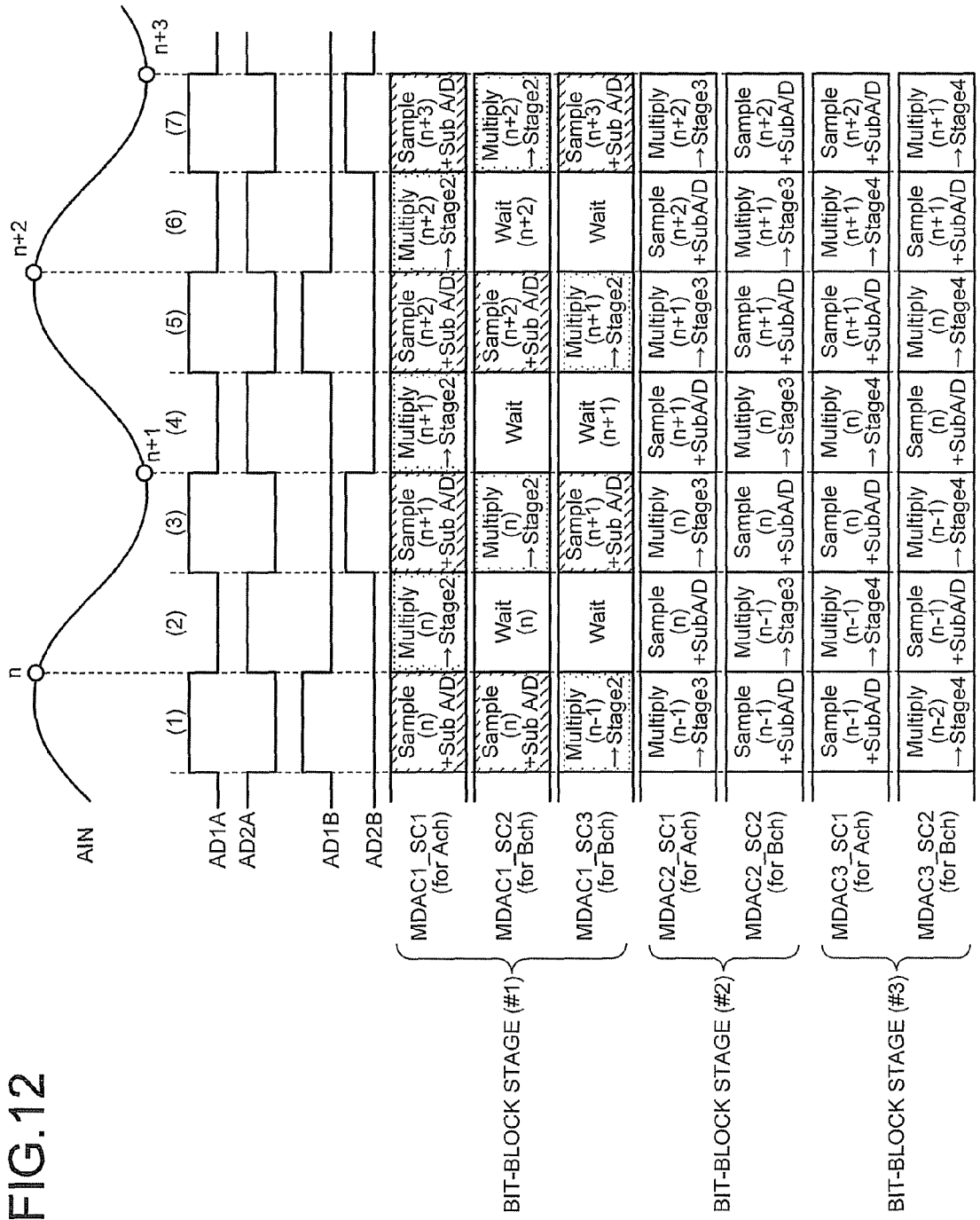
FIG. 12 is a timing chart for explaining the operation of the pipeline stage of the pipeline-type A/D converting unit depicted in FIG. 11.
Figure 13:
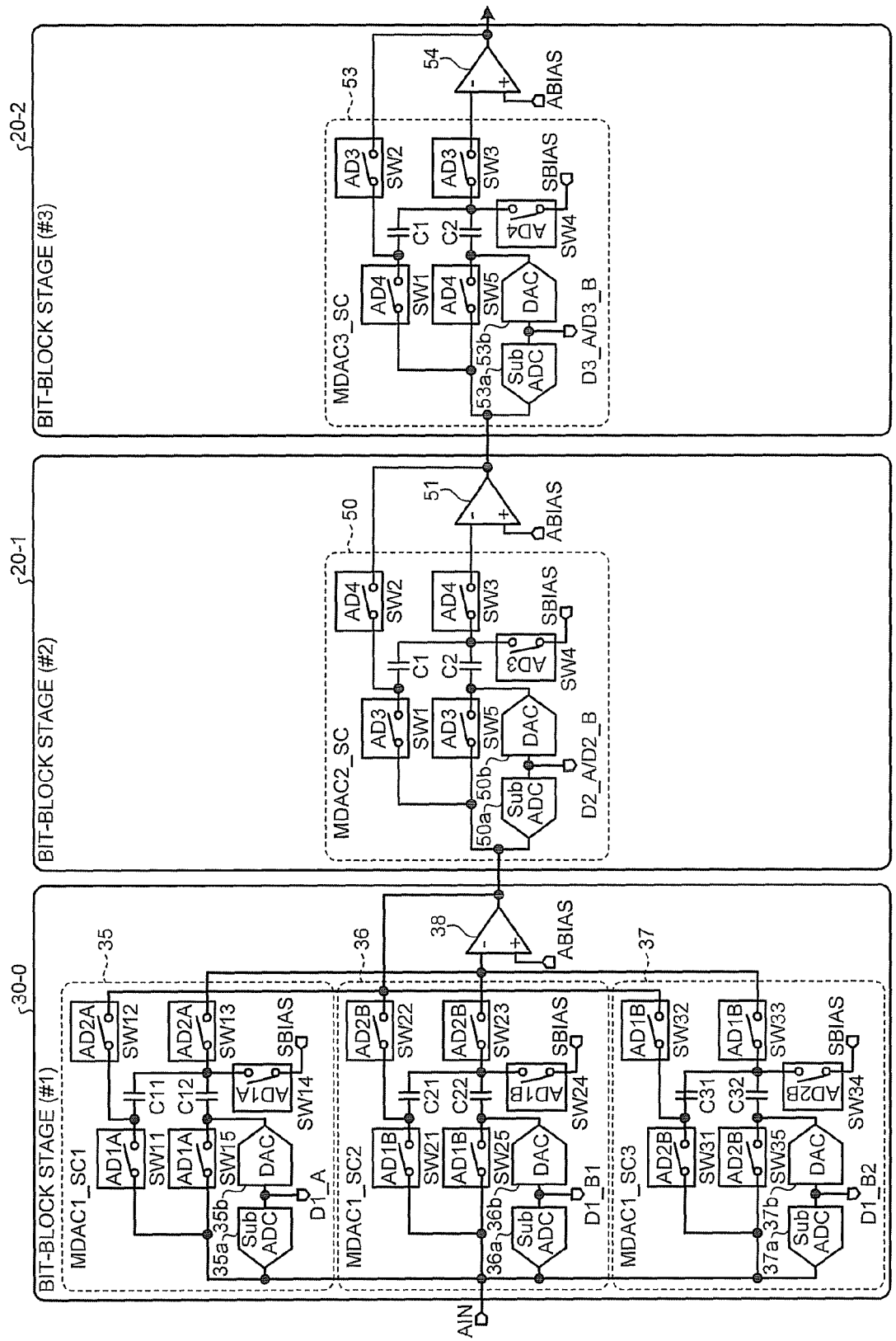
FIG. 13 is a circuit diagram of a second example of configuration of a pipeline stage of a pipeline-type A/D converting unit depicted in FIG. 10.
Figure 14:
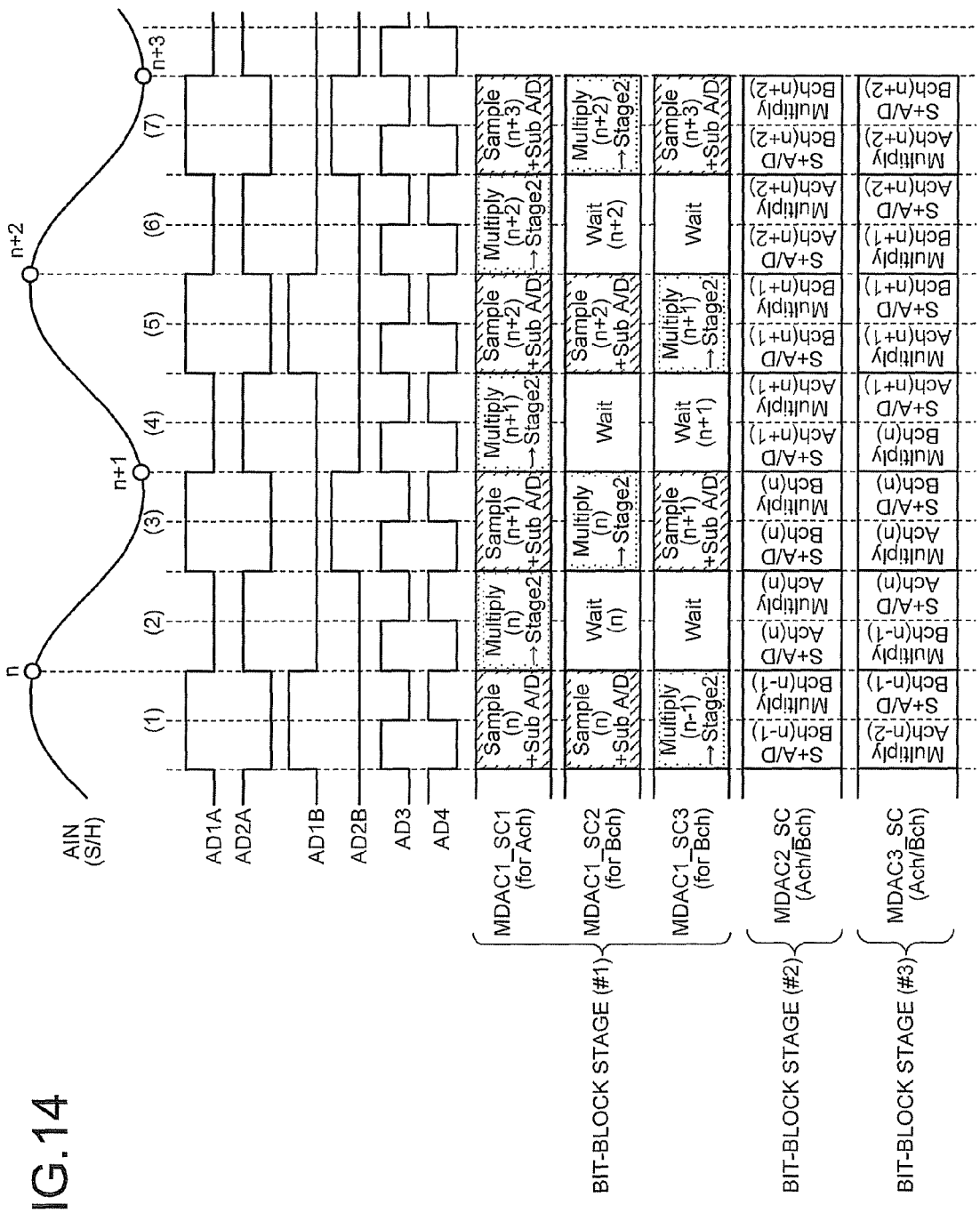
FIG. 14 is a timing chart for explaining the operation of the pipeline stage of the pipeline-type A/D converting unit depicted in FIG. 13.

The pipeline stage of the pipeline-type A/D converting unit 30 is configured as depicted in FIGS. 11 and 13. The operation of the pipeline stage of the pipeline-type A/D converting unit depicted in FIG. 11 is as depicted in FIG. 12, while the operation of the pipeline stage of the pipeline-type A/D converting unit depicted in FIG. 13 is as depicted in FIG. 14.

In the pipeline stage of the pipeline-type A/D converting unit depicted in FIG. 11, each bit-block stage at the second stages and thereafter includes two multiplying D/A converting/sampling function units (MDAC_SC) disposed in parallel and one OP amp. The configuration of these components is similar to that depicted in FIG. 6, and operate according to the similar control signals AD1A and AD2A. As depicted in FIG. 12, details about each bit-block stage at the second stage and thereafter are identical to those depicted in FIG. 7.

Also, in the pipeline stage of the pipeline-type A/D converting unit depicted in FIG. 13, each bit-block stage at the second stages and thereafter includes one multiplying D/A converting/sampling function unit (MDAC_SC) and one OP amp. The configuration of these components is similar to that depicted in FIG. 8, and operate according to the similar control signals AD3 and AD4. As depicted in FIG. 14, details about each bit-block stage at the second stage and thereafter are identical to those depicted in FIG. 9.

Therefore, the configuration and operation of the bit-block stage (#1) 30-0 at the first stage according to the third embodiment is explained herein, and the configuration and operation of the bit-block stage at the second stage and thereafter is omitted.

[Configuration of the Bit-Block Stage (#1) 30-0]

As depicted in FIGS. 11 and 13, the bit-block stage (#1) 30-0 at the first stage where the analog signal AIN is input includes three multiplying D/A converting/sampling function units (MDAC1_SC1) 35, (MDAC1_SC2) 36, and (MDAC1_SC3) 37 having the same configuration, and one OP amp 38. A non-inverting input terminal (+) of the OP amp 38 is supplied with an amp bias ABIAS.

The multiplying D/A converting/sampling function unit (MDAC1_SC1) 35 includes switches SW11, SW12, SW13, SW14, and SW15, capacitative elements C11 and C12, a sub-A/D converter (SubADC) 35a, and a D/A converter (DAC) 35b.

The analog signal AIN is input to one end of the switches SW11 and SW15 and the sub-A/D converter 35a. An output terminal of the sub-A/D converter 35a is connected to an input terminal of the D/A converter 35b and the error-correcting/data-aligning circuit 21. The other end of the switch SW11 has connected thereto one end of the switch SW12 and one end of the capacitative element C11. The other end of the switch SW12 is connected to an output terminal of the OP amp 38. The other end of the switch SW15 and an output terminal of the D/A converter 35b are connected to one end of the capacitative element C12. The other end of the capacitative elements C11 and C12 are commonly connected to one end of the switches SW13 and SW14. The other end of the switch SW13 is connected to an inverting input terminal (−) of the OP amp 38. The other end of the switch SW14 is supplied with a sampling bias SBIAS.

The switches SW11, SW14, and SW15 are subjected to open/close control with a control signal AD1A. The switches SW12 and SW13 are subjected to open/close control with a control signal AD2A. The sub-A/D converter 35a outputs data D1_A for Ach.

The multiplying D/A converting/sampling function unit (MDAC2_SC2) 36 includes switches SW21, SW22, SW23, SW24, and SW25, capacitative elements C21 and C22, a sub-A/D converter (subADC) 36a, and a D/A converter (DAC) 36b.

The analog signal AIN is input to one end of the switches SW21 and SW25, and the sub-A/D converter 36a. An output terminal of the sub-A/D converter 36a is connected to an input terminal of the D/A converter 36b and the error-correcting/data-aligning circuit 21. The other end of the switch SW21 has connected thereto one end of the switch SW22 and one end of the capacitative element C21. The other end of the switch SW22 is connected to an output terminal of the OP amp 38. The other end of the switch SW25 and an output terminal of the D/A converter 36b are connected to one end of the capacitative element C22. The other ends of the capacitative elements C21 and C22 are commonly connected to one end of the switches SW23 and SW24. The other end of the switch SW23 is connected to an inverting input terminal (−) of the OP amp 38. The other end of the switch SW24 is supplied with a sampling bias SBIAS.

The switches SW21, SW24, and SW25 are subjected to open/close control with a control signal AD1B. The switches SW22 and SW23 are subjected to open/close control with a control signal AD2B. The sub-A/D converter 36a outputs data D1_B1 for Bch.

The multiplying D/A converting/sampling function unit (MDAC1_SC3) 37 includes switches SW31, SW32, SW33, SW34, and SW35, capacitative elements C31 and C32, a sub-A/D converter (subADC) 37a, and a D/A converter (DAC) 37b.

The analog signal AIN is input to one end of the switches SW31 and SW35, and the sub-A/D converter 37a. An output terminal of the sub-A/D converter 37a is connected to an input terminal of the D/A converter 37b and the error-correcting/data-aligning circuit 21. The other end of the switch SW31 has connected thereto one end of the switch SW32 and one end of the capacitative element C31. The other end of the switch SW32 is connected to the output terminal of the OP amp 38. The other end of the switch SW35 and an output terminal of the D/A converter 37b are connected to one end of the capacitative element C32. The other ends of the capacitative elements C31 and C32 are commonly connected to one end of the switches SW33 and SW34. The other end of the switch SW33 is connected to the inverting input terminal (−)

of the OP amp 38. The other end of the switch SW34 is supplied with a sampling bias SBIAS.

The switches SW31, SW34, and SW35 are subjected to open/close control with the control signal AD2B. The switches SW32 and SW33 are subjected to open/close control with the control signal AD1B. The sub-A/D converter 37a outputs data D1_B2 for Bch.

[Operation of the Bit-Block Stage (#1) 30-0]

In FIGS. 12 and 14, in an operation period (1), the control signals AD1A and AD1B are in an ON state, while the control signals AD2A and AD2B are in an OFF state. With this, the following operations (a), (b), and (c) are performed.

(a) In the multiplying D/A converting/sampling function unit (MDAC1_SC1) 35, the switches SW11, SW14, and SW15 are in a closed-circuit state, while the switches SW12 and SW13 are in an open-circuit state. Therefore, in the multiplying D/A converting/sampling function unit (MDAC1_SC1) 35, a sampling operation is performed on the capacitative elements C1 and C12 for the analog value (n) of the input analog signal AIN, and the analog value (n) is held in the capacitative elements C11 and C12 at the timing n when the control signal AD1A is turned OFF. Concurrently, in the sub-A/D converter 35a, a logical value of the most significant bit is determined for the analog value (n) of the input analog signal AIN. Then, data D1_A for Ach is output to the D/A converter 35b and the error-correcting/data-aligning circuit 21.

(b) In the multiplying D/A converting/sampling function unit (MDAC1_SC2) 36, the switches SW21, SW24, and SW25 are in a closed-circuit state, while the switches SW22 and SW23 are in an open-circuit state. Therefore, in the multiplying D/A converting/sampling function unit (MDAC1_SC2) 36, a sampling operation is performed on the capacitative elements C21 and C22 for the analog value (n) of the input analog signal AIN, and the analog value (n) is held in the capacitative elements C21 and C22 at the timing n when the control signal AD1A is turned OFF. Concurrently, in the sub-A/D converter 36a, a logical value of the most significant bit is determined for the analog value (n) of the input analog signal AIN. Then, data D1_B1 for Bch is output to the D/A converter 36b and the error-correcting/data-aligning circuit 21.

(c) In the multiplying D/A converting/sampling function unit (MDAC1_SC3) 37, the switches SW31, SW34, and SW35 are in an open-circuit state, while the switches SW32 and SW33 are in a closed-circuit state. Therefore, in the multiplying D/A converting/sampling function unit (MDAC1_SC3) 37, while the control signal AD1B is in an ON state, an adding/subtracting process by the D/A converter 37b via the capacitative element C32 according to the conversion result D1_B by the sub-A/D converter 37a obtained at the previous timing n−1 and a multiplying process by a predetermined factor ((C31+C32)/C31) determined by a capacitance ratio between the capacitative elements C31 and C32 are performed on the analog value (n−1) sampled in the capacitative elements C31 and C32 at the previous timing n−1. Then, the process result is output from the OP amp 38 to the bit-block stage (#2) 30-1 as an analog value (n−1) after the adding/subtracting process for Bch.

In the next operation period (2), the control signal AD2A is in an ON state, while the controls signals AD1A, AD1B, and AD2B are in an OFF state. With this, the following operations (d), (e), and (f) are performed.

(d) In the multiplying D/A converting/sampling function unit (MDAC1_SC1) 35, the switches SW11, SW14, and SW15 are in an open-circuit state, while the switches SW12 and SW13 are in a closed-circuit state. Therefore, in the multiplying D/A converting/sampling function unit (MDAC1_SC1) 35, while the control signal AD2A is in an ON state, an adding/subtracting process by the D/A converter 37b via the capacitative element C12 according to the conversion result D1_A by the sub-A/D converter 35a obtained at the timing n and a multiplying process by a predetermined factor ((C11+C12)/C11) determined by a capacitance ratio between the capacitative elements C11 and C12 are performed on the analog value (n) held in the capacitative elements C11 and C12 at the timing n. Then, the process result is output from the OP amp 38 to the bit-block stage (#2) 30-1 as an analog value (n) after the adding/subtracting process for Ach.

(e) In the multiplying D/A converting/sampling function unit (MDAC1_SC2) 36, all of the switches SW21, SW22, SW23, SW24, and SW25 are in an open-circuit state. Therefore, the multiplying D/A converting/sampling function unit (MDAC1_SC2) 36 is in a wait state Wait(n) while holding the analog value (n) in the capacitative elements C21 and C22.

(f) In the multiplying D/A converting/sampling function unit (MDAC1_SC3) 37, all of the switches SW31, SW32, SW33, SW34, and SW35 are in an open-circuit state. Therefore, the multiplying D/A converting/sampling function unit (MDAC1_SC3) 37 is in a wait state Wait without any analog value to be held in the capacitative elements C31 and C32.

In the next operation period (3), the control signals AD1A and AD2B are in an ON state, while the control signals AD2A and AD1B are in an OFF state. With this, the following operations (g), (h), and (i) are performed.

(g) In the multiplying D/A converting/sampling function unit (MDAC1_SC1) 35, the switches SW11, SW14, and SW15 are in a closed-circuit state, while the switches SW12 and SW13 are in an open-circuit state. Therefore, in the multiplying D/A converting/sampling function unit (MDAC1_SC1) 35, a sampling operation is performed on the capacitative elements C11 and C12 for the analog value (n+1) of the input analog signal AIN, and the analog value (n+1) is held in the capacitative elements C11 and C12 at the timing n+1 when the control signal AD1A is turned OFF. Concurrently, in the sub-A/D converter 35a, a logical value of the most significant bit is determined for the analog value (n+1) of the input analog signal AIN. Then, data D1_A for Ach is output to the D/A converter 35b and the error-correcting/data-aligning circuit 21.

(h) In the multiplying D/A converting/sampling function unit (MDAC1_SC2) 36, the switches SW21, SW24, and SW25 are in an open-circuit state, while the switches SW22 and SW23 are in a closed-circuit state. Therefore, in the multiplying D/A converting/sampling function unit (MDAC1_SC2) 36, while the control signal AD2B is in an ON state, an adding/subtracting process by the D/A converter 36b via the capacitative element C22 according to the conversion result D1_B by the sub-A/D converter 35a obtained at the timing n and a multiplying process by a predetermined factor ((C21+C22)/C21) determined by a capacitance ratio between the capacitative elements C21 and C22 are performed on the analog value (n) sampled and held in the capacitative elements C21 and C22 at the previous timing n. Then, the process result is output from the OP amp 38 to the bit-block stage (#2) 30-1 as an analog value (n+1) after the adding/subtracting process for Bch.

(i) In the multiplying D/A converting/sampling function unit (MDAC1_SC3) 37, the switches SW31, SW34, and SW35 are in a closed-circuit state, while the switches SW32 and SW33 are in an open-circuit state. Therefore, in the multiplying D/A converting/sampling function unit (MDAC1_SC3) 37, a sampling operation is performed on the capacitative elements C31 and C32 for the analog value (n+1) of the input analog signal AIN, and the analog value (n+1) is held in the capacitative elements C31 and C32 at the timing n+1 when the control signal AD2B is turned OFF. Concurrently, in the sub-A/D converter 37a, a logical value of the most significant bit is determined for the analog value (n+1) of the input analog signal AIN. Then, data D1_B2 for Bch is output to the D/A converter 37b and the error-correcting/data-aligning circuit 21.

In the next operation period (4), the control signal AD2A is in an ON state, while the control signals AD1A, AD1B, and AD2B are in an OFF state. With this, the following operations (j), (k), and (l) are performed.

(j) In the multiplying D/A converting/sampling function unit (MDAC1_SC1) 35, the switches SW11, SW14, and SW15 are in an open-circuit state, while the switches SW12 and SW13 are in a closed-circuit state. Therefore, in the multiplying D/A converting/sampling function unit (MDAC1_SC1) 35, while the control signal AD2A is in an ON state, an adding/subtracting process by the D/A converter 35b via the capacitative element C12 according to the conversion result D1_A by the sub-A/D converter 35a obtained at the timing n and a multiplying process by the predetermined factor ((C11+C12)/C11) determined by the capacitance ratio between the capacitative elements C11 and C12 are performed on the analog value (n+1) sampled and held in the capacitative elements C11 and C12 at the timing n+1. Then, the process result is output from the OP amp 38 to the bit-block stage (#2) 30-1 as an analog value (n+1) after the adding/subtracting process for Ach.

(k) In the multiplying D/A converting/sampling function unit (MDAC1_SC2) 36, all of the switches SW21, SW22, SW23, SW24, and SW25 are in an open-circuit state. Therefore, the multiplying D/A converting/sampling function unit (MDAC1_SC2) 36 is in a wait state Wait without any analog value to be held in the capacitative elements C21 and C22.

(l) In the multiplying D/A converting/sampling function unit (MDAC1_SC3) 37, all of the switches SW31, SW32, SW33, SW34, and SW35 are in an open-circuit state. Therefore, the multiplying D/A converting/sampling function unit (MDAC1_SC3) 37 is in a wait state Wait(n) while holding the analog value (n+1) in the capacitative elements C31 and C32.

In the next operation period (5), the control signals AD1A and AD1B are in an ON state, while the control signals AD2A and AD2B are in an OFF state, which is identical to the state in the operation period (1). In the next operation period (6), the control signal AD2A is in an ON state, while the controls signals AD1A, AD1B, and AD2B are in an OFF state, which is identical to the state in the operation period (2). In the next operation period (7), the control signals AD1A and AD2B are in an ON state, while the control signals AD2A and AD1B are in an OFF state, which is identical to the state in the operation period (3). Therefore, in the operation period (5) and thereafter, the operations explained in the operation periods (1), (2), (3), and (4) are repeated in this order, and an analog value for Ach and an analog value for Bch are alternately and successively output to the bit-block stage (#2) 20-1 at the second stage.

According to the third embodiment, as with the second embodiment, in addition to a reduction in power consumption, the configuration can be more simplified than that of the second embodiment.

Further effects and modification examples can be easily lead by a person skilled in the art. Therefore, more wide-ranging embodiments of the present invention are not restricted to a specific detail and a typical embodiment depicted and explained above. Thus, various changes can be thought without deviating from the spirit or range of a general concept of the invention defined by the attached claims and their equivalents.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An A/D converter comprising:
   a sample/hold unit that samples an input analog signal at a predetermined timing to hold m (m≧2) equal analog values and successively outputs the m held equal analog values in time series;
   an A/D converting unit that converts the m equal analog values successively input in time series from the sample/hold unit to m digital signals in time series;
   a data-alignment adjusting circuit that adjusts timings of the m digital signals successively input in time series from the A/D converting unit to parallelize the m digital signals; and
   an averaging circuit that outputs an average value of the m digital signals input in parallel from the data-alignment adjusting circuit as a final A/D conversion result, wherein
   the A/D converting unit is configured of one A/D converting unit that converts the m equal analog values successively output in time series from the sample/hold unit to the m digital signals in a processing time that is 1/m of a time interval in which the sample/hold unit samples the m analog values.

2. The A/D converter according to claim 1, wherein
   the sample/hold unit includes m+1 sampling function units to which the analog signal is input in parallel, and one operational amplifier that outputs the analog values held in the m+1 sampling function units to the A/D converting unit at a subsequent stage, and
   the sample/hold unit successively outputs the m held values in time series to the A/D converting unit at the subsequent stage by repeating an operation in which:
   m sampling function units among the m+1 sampling function units start and end at a same timing a sampling operation on the input analog signal with respective control signals to hold the m equal analog values, and sequentially couple the analog values one by one to the operational amplifier to successively output the m held values in time series to the A/D converting unit at the subsequent stage, and
   at a timing of coupling a last one of the analog values to the operational amplifier, the m sampling function units with their combination changed sample at a same timing a similarly-input analog signal with respective control signals, and sequentially couple the analog values one by one to the operational amplifier.

3. The A/D converter according to claim 2, wherein
   the A/D converting unit is configured of a pipeline-type A/D converting unit that sequentially converts the m equal analog values successively input in time series from the sample/hold unit to m digital signals sequentially from a most significant bit through pipeline processing.

4. An A/D converter comprising:

a pipeline-type A/D converting unit that converts an input analog signal to m (m≧2) digital signals sequentially from a most significant bit through pipeline processing;

a data-alignment adjusting circuit that adjusts timings of the m digital signals successively input in time series from the pipeline-type A/D converting unit to parallelize the m digital signals; and an averaging circuit that outputs an average value of the m digital signals input in parallel from the data-alignment adjusting circuit as a final A/D conversion result, wherein an initial stage of the pipeline-type A/D converting unit includes m+1 sampling function units to which the analog signal is input in parallel, and one operational amplifier that outputs the analog values held in the m+1 sampling function units to a subsequent stage, the m+1 sampling function units and the operational amplifier successively outputting m held values in time series to the subsequent stage by repeating an operation in which:

m sampling function units among the m+1 sampling function units start and end at a same timing a sampling operation on the input analog signal with respective control signals to hold the m equal analog values, and sequentially couple the analog values one by one to the operational amplifier to successively output the m held values to the subsequent stage, and at a timing of coupling a last one of the analog values to the operational amplifier, the m sampling function units with their combination changed each sample a similarly-input analog signal with a respective control signal at a same timing, and sequentially couple the analog values one by one to the operational amplifier, m+1 comparing function units provided to have a one-to-one relation with the m+1 sampling function units, each of the m+1 comparing function units determining a logical value of a most significant bit from the input analog signal, and m+1 D/A converting units provided to have a one-to-one relation with the m+1 comparing function units, each of the m+1 D/A converting units performing an adding/subtracting process on a held value coupled by a relevant one of the sampling function units to the operational amplifier according to a comparison result from a relevant one of the comparing function units.

5. The A/D converter according to claim 4, wherein each stage of the pipeline-type A/D converting unit includes m sampling function units to which m held values are successively input in parallel and in time series from a previous stage, and one operational amplifier that outputs analog values held by the m sampling function units to a subsequent stage, the m sampling function units and the operational amplifier successively outputting m held values in time series to a subsequent stage by repeating an operation in which the m sampling function units hold m equal analog values with respective control signals with a processing time equal to the time interval in which the sample/hold unit samples the m analog values, and sequentially couple the analog values one by one to the operational amplifier to successively output the m held values to the subsequent stage, m comparing function units provided to have a one-to-one relation with the m sampling function units, each of the m comparing function units determining a logical value of a bit corresponding to the own stage of the comparing function unit from the input analog signal, and m D/A converting unit provided to have a one-to-one relation with the m comparing function units, the m D/A converting units performing an adding/subtracting process on a held value coupled by a relevant one of the sampling function units to the operational amplifier according to a comparison result from a relevant one of the comparing function units.

6. The A/D converter according to claim 4, wherein each stage of the pipeline-type A/D converting unit includes a sampling function unit to which m held values are successively input in time series from a previous stage, and an operational amplifier that outputs an analog value held by the sampling function unit to a subsequent stage, the sampling function unit and the operational amplifier successively outputting the m held values in time series to the subsequent stage by repeating an operation in which the sampling function unit holds m equal analog values with respective control signals with a processing time that is 1/m of a time interval in which the sample/hold unit samples the m analog values, and sequentially couples the analog values one by one to the operational amplifier to successively output the m held values to the subsequent stage, a comparing function unit that determines a logical value of a bit corresponding to the own stage of the comparing function unit from the input analog signal, and a D/A converting unit that performs an adding/subtracting process on a held value coupled by the sampling function unit to the operational amplifier according to a comparison result from the comparing function unit.

7. The A/D converter according to claim 4, wherein each of a second stage and thereafter of the pipeline-type A/D converting unit includes m sampling function units to which m held values are successively input in parallel and in time series from a previous stage, and one operational amplifier that outputs analog values held by the m sampling function units to a subsequent stage, the m sampling function units and the operational amplifier successively outputting m held values in time series to a subsequent stage by repeating an operation in which the m sampling function units hold m equal analog values with respective control signals with a processing time equal to the time interval in which the sample/hold unit samples the m analog values, and sequentially couple the analog values one by one to the operational amplifier to successively output the m held values to the subsequent stage, m comparing function units provided to have a one-to-one relation with the m sampling function units, each of the m comparing function units determining a logical value of a bit corresponding to the own stage of the comparing function unit from the input analog signal, and m D/A converting unit provided to have a one-to-one relation with the m comparing function units, the m D/A converting units performing an adding/subtracting process on a held value coupled by a relevant one of the sampling function units to the operational amplifier according to a comparison result from a relevant one of the comparing function units.

8. The A/D converter according to claim 4, wherein
each of a second stage and thereafter of the pipeline-type A/D converting unit includes
a sampling function unit to which m held values are successively input in time series from a previous stage, and an operational amplifier that outputs an analog value held by the sampling function unit to a subsequent stage, the sampling function unit and the operational amplifier successively outputting the m held values in time series to the subsequent stage by repeating an operation in which the sampling function unit holds m equal analog values with respective control signals with a processing time that is 1/m of a time interval in which the sample/hold unit samples the m analog values, and sequentially couples the analog values one by one to the operational amplifier to successively output the m held values to the subsequent stage,
a comparing function unit that determines a logical value of a bit corresponding to the own stage of the comparing function unit from the input analog signal, and
a D/A converting unit that performs an adding/subtracting process on a held value coupled by the sampling function unit to the operational amplifier according to a comparison result from the comparing function unit.

9. A random-noise reducing method for A/D converters, the method comprising:
sampling an input analog signal at a predetermined timing to hold m (m≧2) equal analog values and successively outputting the m held equal analog values in time series;
converting the m equal analog values successively input in time series to m digital signals in time series; and
adjusting timings of the m digital signals converted in time series, parallelizing the m digital signals, and outputting an average value of the m digital signals as a final A/D conversion result, wherein
the converting the m equal analog values to m digital signals in time series for generation is performed by one A/D converting unit in a processing time that is 1/m of a time interval for sampling the m analog values.

10. The random-noise reducing method for A/D converters according to claim 9, wherein
the sampling an input analog signal at a predetermined timing to hold m (m≧2) equal analog values and successively outputting the m held equal analog values in time series is achieved by repeating an operation in which, in m+1 sampling function units to which the analog signal is input in parallel and one operational amplifier that outputs the analog values held in the m+1 sampling function units to the A/D converting at a subsequent stage, m sampling function units among the m+1 sampling function units start and end at a same timing a sampling operation on the input analog signal with respective control signals to hold the m equal analog values, and sequentially couple the analog values one by one to the operational amplifier to successively output the m held values in time series to the A/D converting at the subsequent stage and, at a timing of coupling a last one of the analog values to the operational amplifier, the m sampling function units with their combination changed sample at a same timing a similarly-input analog signal with respective control signals, and sequentially couple the analog values one by one to the operational amplifier.

11. The random-noise reducing method for A/D converters according to claim 10, wherein
the converting the m equal analog values to m digital signals in time series for generation is achieved through sequential conversion by a pipeline-type A/D converting unit to m digital signals sequentially from a most significant bit through pipeline processing.

12. A random-noise reducing method executed in A/D converters, each of the A/D converters includes a pipeline-type A/D converting unit that converts an input analog signal to m (m≧2) digital signals sequentially from a most significant bit through pipeline processing, a data-alignment adjusting circuit that adjusts timings of the m digital signals successively input in time series from the pipeline-type A/D converting unit to parallelize the m digital signals, and an averaging circuit that outputs an average value of the m digital signals input in parallel from the data-alignment adjusting circuit as a final A/D conversion result, the method comprising:
successively outputting m held values in time series to the subsequent stage by repeating an operation at an initial stage of the pipeline-type A/D converting unit, in m+1 sampling function units to which the analog signal is input in parallel, and one operational amplifier that outputs the analog values held in the m+1 sampling function units to a subsequent stage, in which:
m sampling function units among the m+1 sampling function units start and end a sampling operation on the input analog signal with respective control signals at a same timing to hold m equal analog values, and sequentially couple the analog values one by one to the operational amplifier to successively output the m held values to the subsequent stage, and
at a timing of coupling a last one of the analog values to the operational amplifier, the m sampling function units with their combination changed each sample a similarly-input analog signal with a respective control signal at a same timing, and sequentially couple the analog values one by one to the operational amplifier;
determining, in m+1 comparing function units, a logical value of a most significant bit from the input analog signal input with a one-to-one relation with the m+1 sampling function units; and
performing, in m+1 D/A converting units provided to have a one-to-one relation with the m+1 comparing function units, an adding/subtracting process on a held value coupled by a relevant one of the sampling function units to the operational amplifier according to a comparison result from a relevant one of the comparing function units.

13. The random-noise reducing method for A/D converters according to claim 12, wherein
in the pipeline-type A/D converting unit, at each stage,
in m sampling function units to which m held values are successively input in parallel and in time series from a previous stage, and one operational amplifier that outputs analog values held by the m sampling function units to a subsequent stage, m held values are successively output in time series to a subsequent stage by repeating an operation in which the m sampling function units hold m equal analog values input in parallel from the previous stage with respective control signals in a processing time equal to the time interval in which the m analog values are sampled at the sampling and holding, and sequentially couple the analog values one by one to the operational amplifier to successively output the m held values to the subsequent stage,
in each of m comparing function units, a logical value of a bit corresponding to the own stage of the comparing function unit is determined from the analog signal input in parallel with a one-to-one relation with the m sampling function units, and in m D/A converting unit provided to have a one-to-one relation with the m comparing function units, an adding/subtracting process is performed on a held value coupled by a relevant one of the sampling function units to the operational amplifier according to a comparison result from a relevant one of the comparing function units.

14. The random-noise reducing method for A/D converters according to claim 12, wherein in the pipeline-type A/D converting unit, at each stage, in a sampling function unit to which m held values are successively input in time series from a previous stage, and an operational amplifier that outputs an analog value held by the sampling function unit to a subsequent stage, m held values are successively output in time series to the subsequent stage by repeating an operation in which the sampling function unit holds m equal analog values successively input in time series from the previous stage with respective control signals in a processing time that is 1/m of a time interval in which the m analog values are sampled at the sampling and holding, and sequentially couples the analog values one by one to the operational amplifier to successively output the m held values to the subsequent stage, in a comparing function unit, a logical value of a bit corresponding to the own stage of the comparing function unit is determined from an analog signal input in parallel to the sampling function unit, and in a D/A converting unit, an adding/subtracting process is performed on a held value coupled by the sampling function unit to the operational amplifier according to a comparison result from the comparing function unit.

15. The random-noise reducing method for A/D converters according to claim 12, wherein in the pipeline-type A/D converting unit, at each of a second stage and thereafter, in m sampling function units to which m held values are successively input in parallel and in time series from a previous stage, and one operational amplifier that outputs analog values held by the m sampling function units to a subsequent stage, m held values are successively output in time series to a subsequent stage by repeating an operation in which the m sampling function units hold m equal analog values input in parallel from the previous stage with respective control signals in a processing time equal to the time interval in which the m analog values are sampled at the sampling and holding, and sequentially couple the analog values one by one to the operational amplifier to successively output the m held values to the subsequent stage;

in each of m comparing function units, a logical value of a bit corresponding to the own stage of the comparing function unit is determined from the analog signal input in parallel from the previous stage with a one-to-one relation with the m sampling function units, and in m D/A converting unit provided to have a one-to-one relation with the m comparing function units, an adding/subtracting process is performed on a held value coupled by a relevant one of the sampling function units to the operational amplifier according to a comparison result from a relevant one of the comparing function units.

16. The random-noise reducing method for A/D converters according to claim 12, wherein in the pipeline-type A/D converting unit, at each of a second stage and thereafter, in a sampling function unit to which m held values are successively input in time series from a previous stage, and an operational amplifier that outputs an analog value held by the sampling function unit to a subsequent stage, m held values are successively output in time series to the subsequent stage by repeating an operation in which the sampling function unit holds m equal analog values successively input in time series from the previous stage with respective control signals in a processing time that is 1/m of a time interval in which the m analog values are sampled at the sampling and holding, and sequentially couples the analog values one by one to the operational amplifier to successively output the m held values to the subsequent stage, in a comparing function unit, a logical value of a bit corresponding to the own stage of the comparing function unit is determined from an analog signal input in parallel to the sampling function unit from the previous stage in time series, and in a D/A converting unit, an adding/subtracting process is performed on a held value coupled by the sampling function unit to the operational amplifier according to a comparison result from the comparing function unit.

* * * * *